US010955681B2

(12) United States Patent
Chen et al.

(10) Patent No.: US 10,955,681 B2
(45) Date of Patent: Mar. 23, 2021

(54) LIGHTING DEVICE WITH MINIATURE ILLUMINATION LIGHT SOURCES AND OPTICAL LENS SHEET

(71) Applicant: ABL IP HOLDING LLC, Conyers, GA (US)

(72) Inventors: Jie Chen, Snellville, GA (US); An Mao, Jersey City, NJ (US); Guan-Bo Lin, Reston, VA (US); Craig Eugene Marquardt, Social Circle, GA (US)

(73) Assignee: ABL IP HOLDING LLC, Conyers, GA (US)

( * ) Notice: Subject to any disclaimer, the term of this patent is extended or adjusted under 35 U.S.C. 154(b) by 0 days.

(21) Appl. No.: 16/507,646

(22) Filed: Jul. 10, 2019

(65) Prior Publication Data

US 2021/0011301 A1    Jan. 14, 2021

(51) Int. Cl.
| | |
|---|---|
| *F21V 9/38* | (2018.01) |
| *G02B 27/09* | (2006.01) |
| *F21V 5/00* | (2018.01) |
| *F21V 7/00* | (2006.01) |
| *F21V 23/00* | (2015.01) |
| *H01L 31/054* | (2014.01) |

(Continued)

(52) U.S. Cl.
CPC .......... *G02B 27/0961* (2013.01); *F21V 5/007* (2013.01); *F21V 5/04* (2013.01); *F21V 7/0091* (2013.01); *F21V 23/003* (2013.01); *H01L 31/02325* (2013.01); *H01L 31/0543* (2014.12); *F21Y 2115/10* (2016.08); *F21Y 2115/15* (2016.08); *G02B 27/0922* (2013.01)

(58) Field of Classification Search
CPC ............ G02B 27/0961; G02B 27/0922; F21V 7/0091; F21V 5/007; F21V 5/04; F21V 23/003; H01L 31/0543; H01L 31/02325; F21Y 2115/15; F21Y 2115/10
See application file for complete search history.

(56) References Cited

U.S. PATENT DOCUMENTS

| | | |
|---|---|---|
| 5,791,757 A | 8/1998 | O'Neil et al. |
| 5,841,596 A | 11/1998 | Perlo et al. |

(Continued)

OTHER PUBLICATIONS

STIC report(search information) (Year: 2020).*

*Primary Examiner* — Tracie Y Green
(74) *Attorney, Agent, or Firm* — RatnerPrestia

(57) ABSTRACT

An example lighting device includes a luminaire having a miniature illumination light source matrix including miniature illumination light sources configured to be driven by electrical power to emit incoming light rays for illumination lighting. Luminaire further includes an optical lens sheet positioned directly over and abutting the miniature illumination light source matrix and configured to extend over the illumination light source matrix and including an input surface coupled to receive the incoming light rays and an output surface lens array. Input surface is a substantially planar lateral surface extending across an entirety of the miniature illumination light source matrix. Output surface lens array includes a plurality of miniature optical lenses, including a respective miniature optical lens for each of the miniature illumination light sources to refract the incoming light rays into an outputted beam pattern of output light rays for the illumination lighting.

20 Claims, 21 Drawing Sheets

(51) Int. Cl.
  *H01L 31/0232* (2014.01)
  *F21V 5/04* (2006.01)
  *G09G 3/20* (2006.01)
  *F21Y 115/15* (2016.01)
  *F21Y 115/10* (2016.01)

(56) References Cited

U.S. PATENT DOCUMENTS

| | | |
|---|---|---|
| 6,871,982 B2 | 3/2005 | Holman et al. |
| 7,006,294 B2 | 2/2006 | Steenblik et al. |
| 7,072,096 B2 | 7/2006 | Holman et al. |
| 8,033,706 B1 | 10/2011 | Kelly et al. |
| 8,348,489 B2 | 1/2013 | Holman et al. |
| 9,977,152 B2 * | 5/2018 | Zhang ............... G02B 3/0018 |
| 10,323,824 B1 * | 6/2019 | Lim ............... B60Q 1/20 |
| 10,527,886 B1 * | 1/2020 | Lin ............... G02F 1/133603 |
| 2003/0016930 A1 | 1/2003 | Inditsky |
| 2012/0057353 A1 * | 3/2012 | Wei ............... F21V 5/007 362/311.09 |
| 2014/0261630 A1 * | 9/2014 | Morgan ............... H02S 20/32 136/246 |
| 2017/0211771 A1 * | 7/2017 | Nishimura ............... F21S 41/25 |
| 2018/0287023 A1 * | 10/2018 | Mizuta ............... H01L 33/54 |
| 2019/0011801 A1 * | 1/2019 | Komanduri ............... G02F 1/29 |
| 2019/0165039 A1 * | 5/2019 | Ku ............... H01L 33/0095 |
| 2019/0267357 A1 * | 8/2019 | Iguchi ............... H01L 25/0753 |
| 2019/0361294 A1 * | 11/2019 | Yang ............... G02F 1/133606 |

* cited by examiner

US 10,955,681 B2

LIGHTING DEVICE WITH MINIATURE ILLUMINATION LIGHT SOURCES AND OPTICAL LENS SHEET

TECHNICAL FIELD

The present subject matter relates to a lighting device, e.g., a luminaire for illumination lighting with miniature illumination light sources and an optical lens sheet, and adjustment of an outputted beam pattern of light passing through the optical lens sheet as well as such techniques for miniature optical-to-electrical transducers.

BACKGROUND

Typical luminaires output illumination lighting at one beam angle. If changes to the output light pattern of the illumination lighting are desired, e.g., in a restaurant, the luminaire can be modified mechanically, which necessitates human labor and costs associated therewith. Some luminaires in the marketplace claim to provide different beam angles, but sacrifice optical efficiency (e.g., by blocking the light), or have a very large format size. For example, a two lens system can change the relative distance of the two lenses, which changes the total focus of the system, as a result the beam shape can change. Illumination lighting luminaires also exist with electrically controllable beam shaping and steering optical systems, but costs of such systems can be very high and have reliability problems.

Existing luminaires utilize high and mid power light emitting diodes (LEDs) as illumination light sources. The optical lens element is relatively large, and spaced out to avoid the interference between the LEDs, which factors into the optical efficiency and lighting distribution. For a wide angle lighting distribution (e.g., a high angle batwing) and asymmetric lighting distribution, the spacing requirement for the optical lens element is very critical. For a given size of illumination area, the optical element, lighting distribution, and control of the beam patterns are limited.

Current thin panel optics for luminaires are edge lit with light guide technology. Unfortunately, the optical density of the luminaire is limited by the edge sides of the luminaire, which are very thin compared to a flat side of a luminaire panel. Because the luminaire panel can only have one lighting distribution, it is not feasible to dynamically shape the lighting distribution.

BRIEF DESCRIPTION OF THE DRAWINGS

The drawing figures depict one or more implementations, by way of example only, not by way of limitations. In the figures, like reference numerals refer to the same or similar elements.

DETAILED DESCRIPTION

Figure 1:
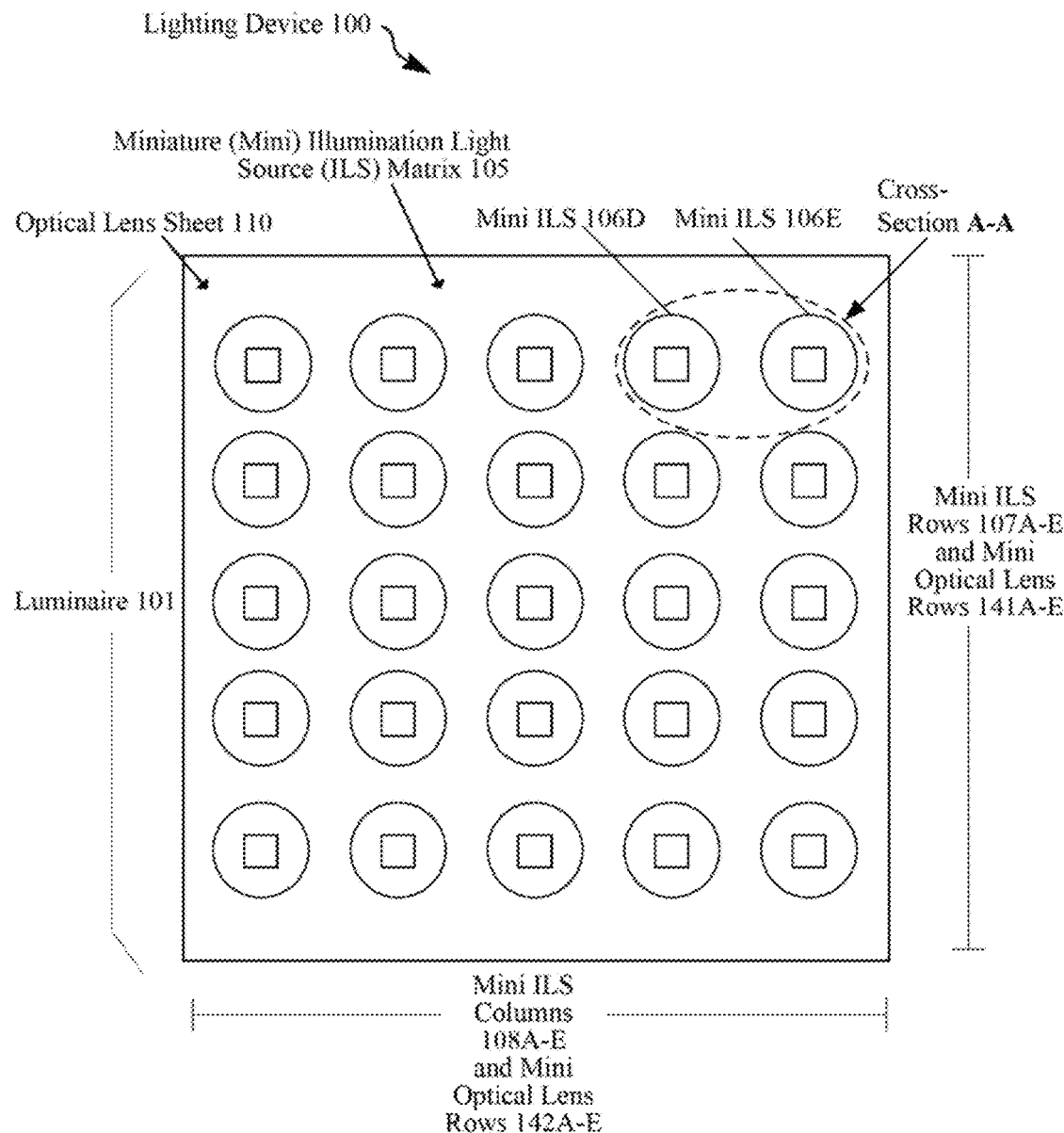
FIG. 1 is a top view of a lighting device, including a luminaire having a miniature (mini) illumination light source (ILS) matrix with multiple miniature illumination light sources and an optical lens sheet.

A luminaire includes miniature illumination light sources and an optical lens sheet to form a high density thin illumination panel, which can be utilized in downlight, indoor, industry, and roadway applications. The luminaire is low cost, reliable, high efficiency, and easily manufactured to provide beam steering and shaping. In a downlight example, the optics of the luminaire can be very thin, such as several millimeters (mm), with a very small pitch to solve pixilation issues so that a diffuser is not needed.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The term "luminaire," as used herein, is intended to encompass essentially any type of device that processes energy to generate or supply artificial light, for example, for general illumination of a space intended for use of occupancy or observation, typically by a living organism that can take advantage of or be affected in some desired manner by the light emitted from the device. However, a luminaire may provide light for use by automated equipment, such as sensors/monitors, robots, etc. that may occupy or observe the illuminated space, instead of or in addition to light provided for an organism. However, it is also possible that one or more luminaires in or on a particular premises have other lighting purposes, such as signage for an entrance or to indicate an exit. In most examples, the luminaire(s) illuminate a space or area of a premises to a level useful for a human in or passing through the space, e.g., of sufficient intensity for general illumination of a room or corridor in a building or of an outdoor space such as a street, sidewalk, parking lot or performance venue. The actual source of illumination light in or supplying the light for a luminaire may be any type of artificial light emitting device, several examples of which are included in the discussions below.

Terms such as "artificial lighting" or "illumination lighting" as used herein, are intended to encompass essentially any type of lighting that a device produces light by processing of electrical power to generate the light. A luminaire for an artificial lighting or illumination lighting application, for example, may take the form of a lamp, light fixture, or other luminaire arrangement that incorporates a suitable light source, where the lighting device component or source(s) by itself contains no intelligence or communication capability. The illumination light output of an artificial illumination type luminaire, for example, may have an intensity and/or other characteristic(s) that satisfy an industry acceptable performance standard for a general lighting application.

The term "coupled" as used herein refers to any logical, optical, physical or electrical connection, link or the like by which signals or light produced or supplied by one system element are imparted to another coupled element. Unless described otherwise, coupled elements or devices are not necessarily directly connected to one another and may be separated by intermediate components, elements or communication media that may modify, manipulate or carry the light or signals.

Light output from the luminaire may carry information, such as a code (e.g. to identify the luminaire or its location) or downstream transmission of communication signaling and/or user data. The light based data transmission may involve modulation or otherwise adjusting parameters (e.g. intensity, color characteristic or distribution) of the illumination light output from the luminaire.

Figure 2A:
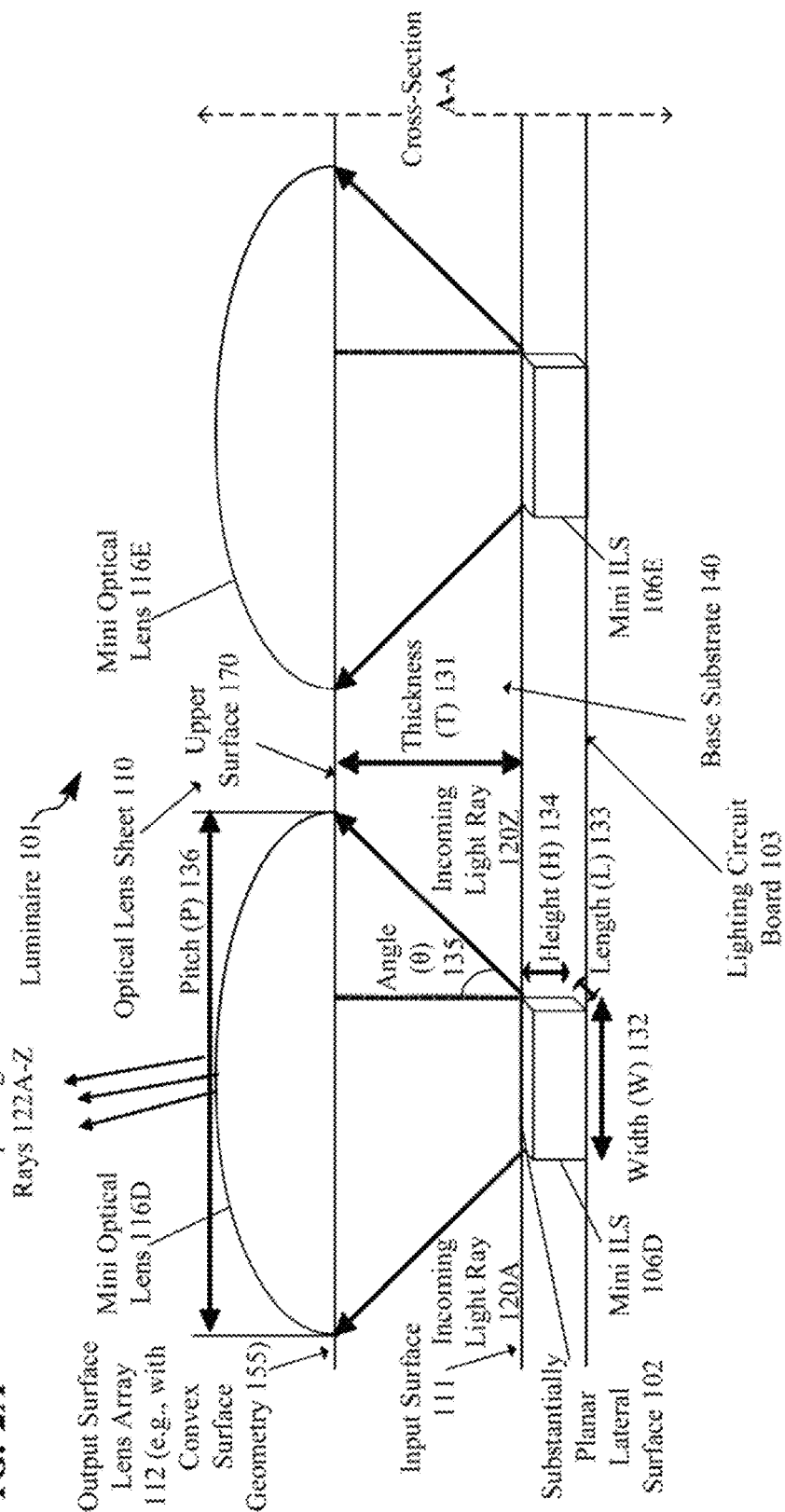
FIG. 2A is an enlarged view of a section of the luminaire of the lighting device of FIG. 1, corresponding to the dashed circle A-A in FIG. 1, showing two of the miniature illumination light sources, in which the input surface is a substantially planar lateral surface.
Figure 2B:
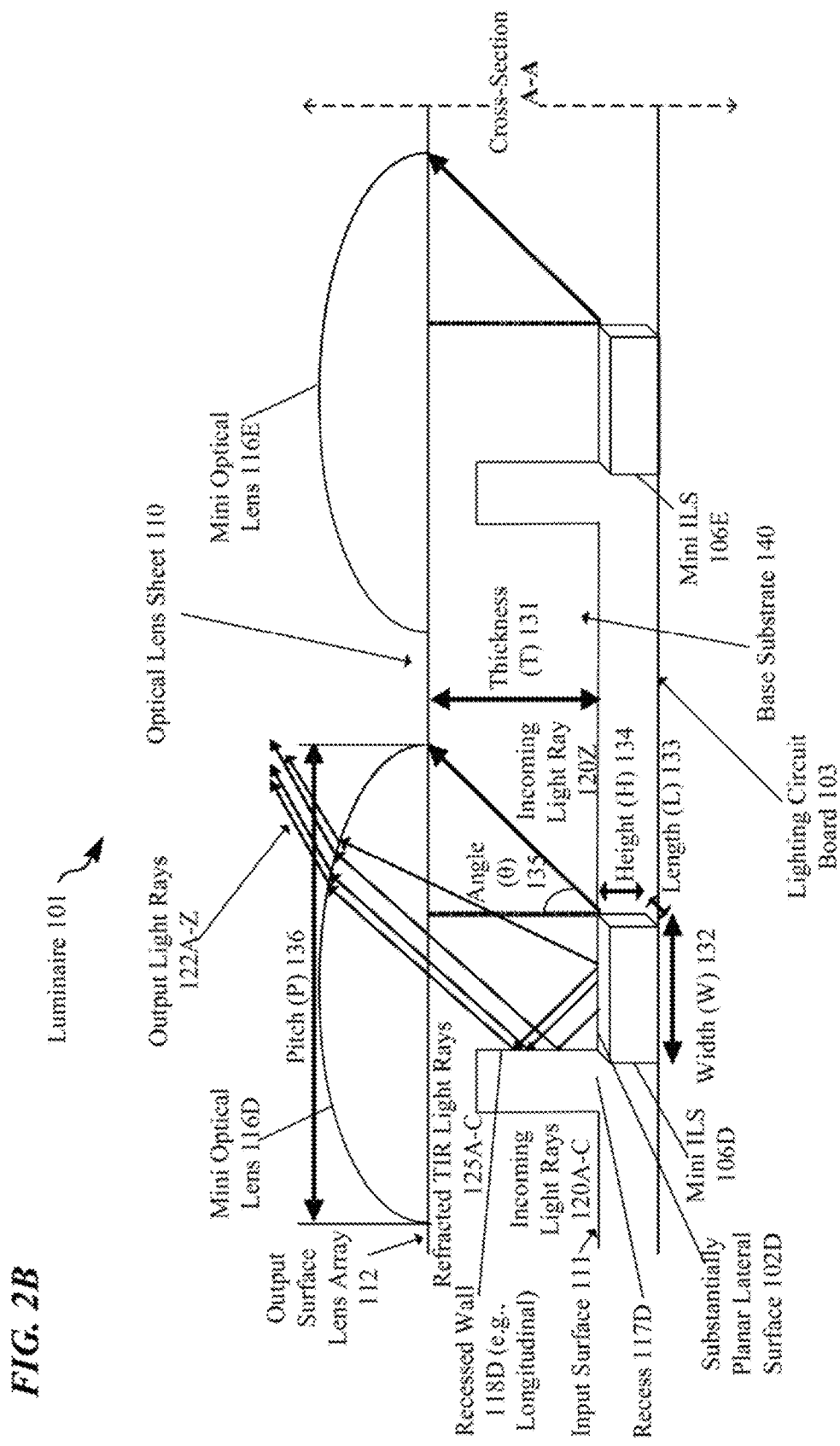
FIG. 2B is another enlarged view of a section of the luminaire of the lighting device of FIG. 1, corresponding to the dashed circle A-A in FIG. 1, showing two of the miniature illumination light sources, in which the input surface alternates between respective recesses and respective substantially planar lateral surfaces.

As used herein, "substantially planar" means mostly flat or level within reasonable manufacturing tolerances, so that the input surface is apparently planar so far as is perceptible. The term "planar" means in the form of a plane; this may include but is not strictly limited to a flat surface as depicted in FIG. 2A. One purpose of the substantially planar input lateral surface shown in FIGS. 2A-B is to provide a thin optical lens sheet and overall thin luminaire panel. If the miniature illumination light sources are not substantially flat (i.e., curved in some detectable amount), then the input surface may be curved to parallel any curvature in the miniature illumination light sources. For example, a flat or slightly parabolic target input surface may facilitate this purpose.

In the discussion herein, a spot lighting application means a beam pattern with a spot lighting beam angle state, which is a beam angle from 4° to 20°. A flood lighting application means a beam pattern with a flood lighting beam angle state, which is a beam angle from 21° to 120°, but can be broken down into a regular flood lighting application and a wide flood lighting application. A regular flood lighting application means a beam pattern with a regular flood lighting beam angle state, which is a beam angle from 21° to 45°. A wide flood lighting application means a beam pattern with a wide flood lighting beam angle state, which is a beam angle from 45° to 120°. A diffuse lighting application means a beam pattern with a diffuse lighting beam angle state, which is a beam angle of 120° or more.

The orientations of the lighting device, luminaire, associated components and/or any complete devices incorporating a miniature optical lens sheet and miniature illumination light sources such as shown in any of the drawings, are given by way of example only, for illustration and discussion purposes. In operation for a particular variable optical processing application, the lighting device, miniature optical lens sheet, and miniature illumination light sources may be oriented in any other direction suitable to the particular application of the lighting device, for example up light or side light or any other orientation. Also, to the extent used herein, any directional term, such as lateral, longitudinal, left, right, up, down, upper, lower, top, bottom, and side, are used by way of example only, and are not limiting as to direction or orientation of any optic or component of an optic constructed as otherwise described herein.

Reference now is made in detail to the examples illustrated in the accompanying drawings and discussed below.

FIG. 1 is a top view of a lighting device 100, including a luminaire 101 having a miniature (mini) illumination light source (ILS) matrix 105 with multiple miniature illumination light sources (ILS) 106A-Y and an optical lens sheet 110. By controlling which of the miniature illumination light sources (ILS) 106A-Y are turned off, on, or dimmed, optical lens sheet 110 can beam shape. The optical lens sheet 110 is a freeform lens with multiple surfaces of different shapes that can exhibit refractive behavior, or total internal reflection (TIR) that is variable. The optical lens sheet 110 can take multiple miniature illumination light sources (ILS) 106A-Y coupled at different locations to an input surface 111 of the optical lens sheet 110 and direct or shape illumination lighting 124 from the different miniature illumination light sources 106A-Y into different beam patterns, for example. Miniature illumination light sources 106A-Y are mini white mini LEDs, for example, which are blue LEDs with a phosphor coating and 200 microns (μm)×200 microns (μm) in width and length respectively; or less than 4,000 microns in area. A micron is known as a micrometer.

Luminaire 101 and optical lens sheet 110 have a profile that is a square shaped. Although shown as having a square shape, in some examples the luminaire 101 and the optical lens sheet 110 may be in the shape of a rectangle, or other polygon; or circular or oval shaped. The shape and size of the optical lens sheet 110 can vary depending on the size of the lighting device 100 or luminaire 101 incorporating the optical lens sheet 110 and the number and size of the miniature illumination light sources 106A-Y disposed under the optical lens sheet 110 as backlight sources. For example, the profile (outline) of the luminaire 101 can be a substantially circular profile, but can be a variable profile depending on the intended application. For example, an elongated rectangular optical lens sheet 110 can be suitable for a miniature illumination light source matrix 105 which includes a large number of miniature illumination light sources 106A-Y.

The miniature illumination light sources 106A-Y are electrical-to-optical transducers to convert an electrical signal into light output, in other words, transform electrical power into light. As explained in more detail in FIGS. 12C and 13 the optical lens sheet 110 can also be utilized with an optical-to-electrical transducer, such as a photo sensor or a photovoltaic device. The miniature illumination light sources 106A-Y can be a white light source, but in many applications the illumination light sources 115A-D can be color controllable (e.g., red, green, and blue).

As shown in FIG. 1, the miniature illumination light sources 106A-Y are arranged in a first series of linear miniature illumination light source rows 107A-E. The miniature optical lenses 116A-Y of the output surface lens array 112 are arranged in a second series of linear miniature optical lens rows 141A-E. Each of the linear miniature illumination light source rows 107A-E of the first series have a same first number of illumination light sources (five). Each of the linear miniature optical lens rows 141A-E of the second series have a same second number of miniature optical lenses (five).

The number of miniature illumination light sources 106A-Y in the lighting device 100 can be more or less than that shown. Only 25 illumination light sources 106A-Y arranged as an array in five miniature illumination light source rows 107A-E and five columns 108A-E and five miniature optical lens rows 141A-E and five columns 142A-E are shown in FIG. 1. However, it should be understood that many hundreds or thousands of illumination light sources 107x and columns 108x and miniature optical lens rows 141x and columns 142x can be arranged in any number of rows and columns, or other matrix formations (e.g., circular or oval), to form a miniature illumination light source matrix 105 and the optical lens sheet 110 of the luminaire 101.

The miniature illumination light sources 106A-Y can be arranged in channels(s). Miniature illumination light sources 106A-Y in a channel can be individually controlled to be turned on, off, or dimmed anywhere along the channel to create different combinations; and can be driven in groups such as rows 107A-E or columns 108A-E. Light output from the miniature illumination light sources 125A-Y can be adjusted between 0% to 100% (dimmed) to obtain different beam patterns and shaping. For example, the miniature illumination light sources 106A-Y in different positions (left channel, middle channel, or right channel) can be turned on, off, or dimmed to vary the light intensity, either individually or in combination, to change the beam pattern and thus achieve beam shaping.

In one example, when the left channels (e.g., columns 108A-B) are turned on and the middle channel (e.g., column 108C) and right channels (columns 108D-E) are off, a desired beam angle and a desired beam pattern are selectively outputted. Generally, a particular area (same area) of a room is illuminated by the different channels 108A-E regardless of the channel selections. However, turning on and off different channels 108A-E, alone or in combination, selectively adjusts the emitted beam pattern and the beam angle to achieve the desired beam angle and the desired beam pattern in the particular area of the room.

Figure 11:
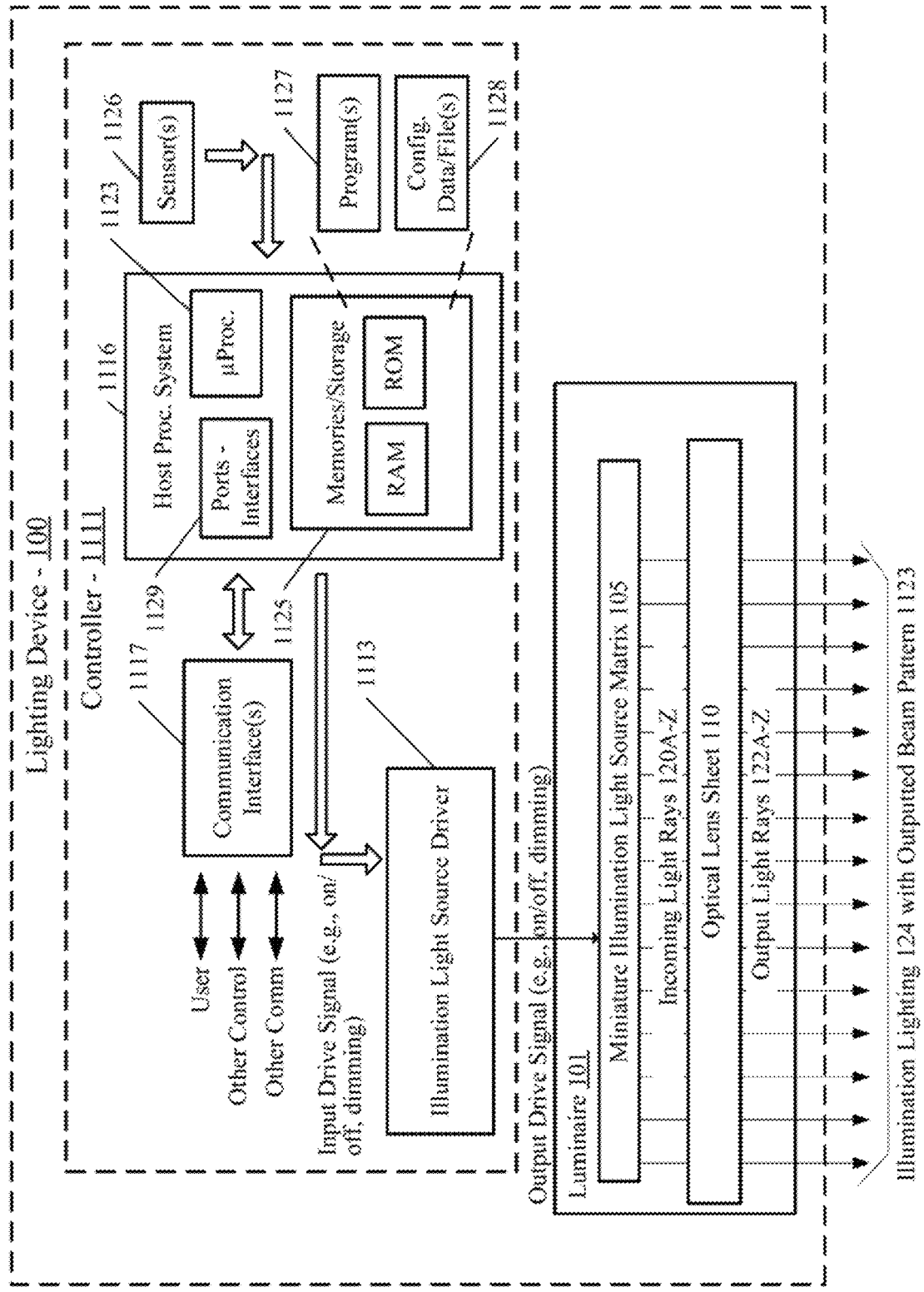
FIG. 11 is a functional block diagram of an example of a lighting device including an illumination light source driver and a luminaire that has a miniature illumination light source matrix and an optical lens sheet, in which the miniature illumination light source matrix is selectively controlled by the illumination light source driver.

In some examples, white miniature illumination light sources 106A-Y are used with different correlated color temperatures (CCTs) and the illumination light source driver 1113 of FIG. 11 may selectively turn, off, or dim only those illumination light sources that are in a group with a particular CCT in a channel. In one example, only the miniature illumination light sources 106A-Y in a group with a CCT of 3,000 Kelvin are driven on by the illumination light source driver 1113 of FIG. 11. Alternatively, only the miniature illumination light sources 106A-Y with a CCT of 4,000 Kelvin or 5,000 Kelvin on a particular channel are turned on by the illumination light source driver 1113 of FIG. 11 to obtain different lighting effects.

Each individual miniature optical lens 116A-Y is dedicated to a particular miniature illumination light source 106A-Y. Miniature optical lenses 116A-Y may have symmetric or asymmetric surface profiles (e.g., curved or sloped) which are different (e.g., non-uniform) from each other, for example, to obtain different effects for different miniature illumination light sources 106A-Y. The miniature optical lens 116D may have a different surface profile than the miniature optical lens 116E. Such differing surface profiles of the miniature optical lenses 116A-Y can achieve different beam angles, lighting distribution, etc. for the miniature illumination light sources in the middle (e.g., column 108C), left side (e.g., columns 108A-B), or right side (e.g., columns 108D-E) of the miniature illumination light source matrix 105, for example.

Upper surface 170 has a series of respective substantially planar lateral surfaces formed in between neighboring miniature optical lenses, such as miniature optical lenses 116D and 116E. However, in another example, the convex shapes of the adjacent miniature optical lenses 116D and 116E may overlap like bubbles and meet at an intersecting point to form a bubble cloud like shape. In this other example, the upper surface 170 in between neighboring miniature optical lenses is a series of intersecting points where neighboring miniature optical lenses meet.

FIG. 2A is an enlarged view of a section of the luminaire 100 of the lighting device 100 of FIG. 1, corresponding to the dashed circle A-A in FIG. 1, showing two of the miniature illumination light sources 106D-E, in which the input surface 111 is a substantially planar lateral surface 112. FIG. 2B is another enlarged view of a section of the luminaire 100 of the lighting device 100 of FIG. 1, corresponding to the dashed circle A-A in FIG. 1, showing two of the miniature illumination light sources 106D-E, in which the input surface 111 alternates between respective recesses 117A-Y and respective substantially planar lateral surfaces 112A-Y. As shown, the miniature illumination light sources 106A-Y can be disposed on a lighting circuit board 103 by way of solder or adhesive. Lighting circuit board 103 is a flexible or rigid type printed circuit board (PCB) with miniature illumination light sources 106A-Y. Due to the small size of the miniature illumination light sources 106A-Y, the optical lens sheet 110 is also thin. If the optical lens sheet 110 is made of a flexible material, such as silicon or plastic, instead of a rigid material and the luminaire 101 includes a flexible printed circuit board (PC) type of lighting circuit board 103, the luminaire may be bent or otherwise shaped for different lighting distribution applications. For example, a first subset of miniature illumination light sources 106A-M may provide an asymmetric beam distribution, while a second subset of miniature illumination light sources 106N-Y may provide a symmetric beam distribution.

Another benefit of the small package size of the luminaire 101 is that a large heat sink is not needed. With large sized LEDs, a relatively large amount of thermal energy (heat) is generated and must be dissipated with a heat sink as fast as possible. Because the miniature illumination light sources 106A-Y are micro sized and spread apart, a large heat sink is not necessary. Yet another benefit of the luminaire 101 is greater lifetime and reliability of the miniature illumination light sources 106A-Y because less heat generation means slower degradation of the miniature illumination light sources 106A-Y.

In the examples herein, the miniature illumination light sources 106A-Y of the miniature illumination light source matrix 105 are utilized a backlit light sources for the optical lens sheet 110 instead of edge lit light sources. FIG. 2A describes the process of designing the luminaire 101, specifically the design of optical lens sheet 110, considering a 2-dimensional case in which the miniature optical lens 110D is designed for the miniature illumination light source 106D. As shown in FIG. 2A, the pitch (P) 136 is typically a diameter of an individual miniature optical lens 116A-Y that is dedicated to a respective miniature illumination light source 106A-Y. The five times rule applies—the point source approximation is accurate only when the thickness (T) 131 of the base substrate 140 of the optical lens sheet 110 to the miniature illumination light source 106D is greater than five times the largest dimension of the illumination light source 106D. Thickness (T) 131 is designed as the distance between the input surface 111 of the base substrate 140 to a corresponding part of an upper surface 170 of the base substrate 170 and will vary in size in proportion to the dimensions of the miniature illumination light source 106D. Assuming width (W) is the largest dimension, the refractive index (n)=1.49 for acrylic, and T=5*W, then the minimum pitch (P) 136 needed for the miniature illumination light source 106D=2*T*tan angle (θ)+W=10*W. This is just an estimation of the ratio between the pitch (P) 136 versus the size dimensions of the miniature illumination light source 106D. In actuality, the ratio will be even larger. In order to achieve pixilation free optical lens sheet 110, the pitch (P) needs to be as small as possible. Let's assume the pitch (P)=2 mm, then the illumination light source 106D size dimensions (width and length) needs to be smaller than 200 micrometers×200 micrometers (0.2 mm×0.2 mm). Thus, let's assume the illumination light source 106D size dimensions (width and length) to be 150 micrometers×150 micrometers (0.15 mm×0.15 mm) in the examples of FIGS. 3-5, 8A-B, 9A-B, and 10A-B discussed below.

As described in FIGS. 3-5, 8A-B, 9A-B, and 10A-B differences between the convex surface geometry 155 (amount of curvature or convex slope) of the miniature optical lenses 116A-Z and thicknesses of the base substrate 140 is utilized to adjust an outputted beam pattern and beam distribution (e.g., from a spot lighting application to a wide flood lighting application). Although not drawn exactly to scale, it can be seen that by reducing the convex slope of the miniature optical lens 116D, the beam angle is increased. Conversely, by increasing the convex slope of the miniature optical lens 116D, the beam angle is increased. Changing the thickness (T) 131 does not necessarily increase the beam angle, for example, the thickness (T) 131 can be a fixed number for both of the three different types of beam angles.

The advantages of the miniature illumination light matrix 105 and optical lens sheet 110 based backlit panel luminaire 101 over an edge lit panel can include the following: good uniformity, easy beam control (from narrow beam to flood beam), high lumen output, thin panel formed in various shapes, and good scalability. For a 2'×2' panel, assuming a pitch of 2 mm, the number of miniature illumination light sources 106x will be around 90,000. Assuming each miniature illumination light source 106A-Y generates 1 lm, and the optical efficiency to be 80%, the total lumen output of the back lit panel luminaire 101 would be 72,000 lm. Normally, an edge lit 2'×2' panel can only provide light around 4,000 lm. Thus, the luminaire 101 is a back lit panel with a high density package of miniature illumination light sources 106A-Y in a very thin package (e.g., on the order of 1 cm) with very high light output.

Various types of miniature illumination light sources 106A-Y may be used, such as one or more organic light emitting diodes (OLEDs); one or more micro LEDs; one or more nanorod or nanowire LEDs; at least one fluorescent lamp; or at least one halogen lamp. In some examples, the optical lens sheet 110 can be utilized to steer or shape outputted light from optical fiber instead of miniature illumination light sources 106A-Y. In an example, miniature illumination light sources 106x include a number of layers forming one or more actual OLEDs (e.g., a stack including multiple emissive, anode, cathode, and transport layers).

The miniature illumination light source matrix 105, including the miniature illumination light sources 106A-Y, can be realized by placing a mask layer over large illumination light sources that are larger than 200 microns with some efficiency tradeoffs. Generally, the miniature illumination light source matrix 105 includes a mask having an array of apertures or controllable light valves, where each aperture or controllable light valve has a length dimension (L) of 0.2 mm (200 microns) or less and a width dimension (W) of 0.2 mm or less. The miniature illumination light source matrix 105 further includes at least one large illumination light source optically coupled to the apertures or the controllable light valves. The at least one large illumination light source is greater than 0.2 mm in the length dimension (L) and greater than 0.2 mm in the width dimension (W). In a first example, micro-machining is utilized to fabricate the mask. The mask is placed on top of LEDs that are larger than 200 microns and form an LED direct-lit backlight array. The mask can be an opaque metallic plate with an array of apertures that are formed as holes with a diameter around a few tens of microns. The micro-machined metallic plate is optically coupled to the LED backlight array to form the miniature illumination light sources 106A-Y and the miniature illumination light source matrix 105 indirectly. In a second example, the miniature illumination light source matrix 105 is formed as a display-like backlight that includes a liquid crystal layer placed on top of an LED backlight layer. Liquid crystals are typically around several microns in size and controllable light valves formed of the liquid crystals are optically coupled to the LED backlight layer and are switchable on and off by a driver circuit to selectively emit light passing through from the LED backlight layer. By turning on different numbers and combinations of adjacent liquid crystal controllable light valves at different positions in the array, miniature illumination light sources 106A-Y are formed that are actually size-tunable and position-tunable. When turned on and off, the controllable light valves behave to control the LED backlight layer to create the miniature illumination light sources 106A-Y, which then behave as sub-200-micron light valves.

The miniature illumination light sources 106A-Y are populated on a flat surface of a lighting circuit board 103 and directly touch a substantially planar (flat) input surface 111 of the optical lens sheet 110. In the optical lens sheet 110, incoming light rays 120A-Z of each miniature illumination light sources 106A-Y become an approximately 42 degree light cone (e.g., depending on the media of the optical lens sheet 110), but assume the media is acrylic in the example. The basic thickness of the optical lens sheet 110 is determined by the spacing of the miniature illumination light sources 106A-Y so that each light cone does not interfere with each other. The miniature optical lens array 112 that includes the miniature optical lenses 116A-Y on the other side of panel is used to shape the beam pattern.

Figure 3:
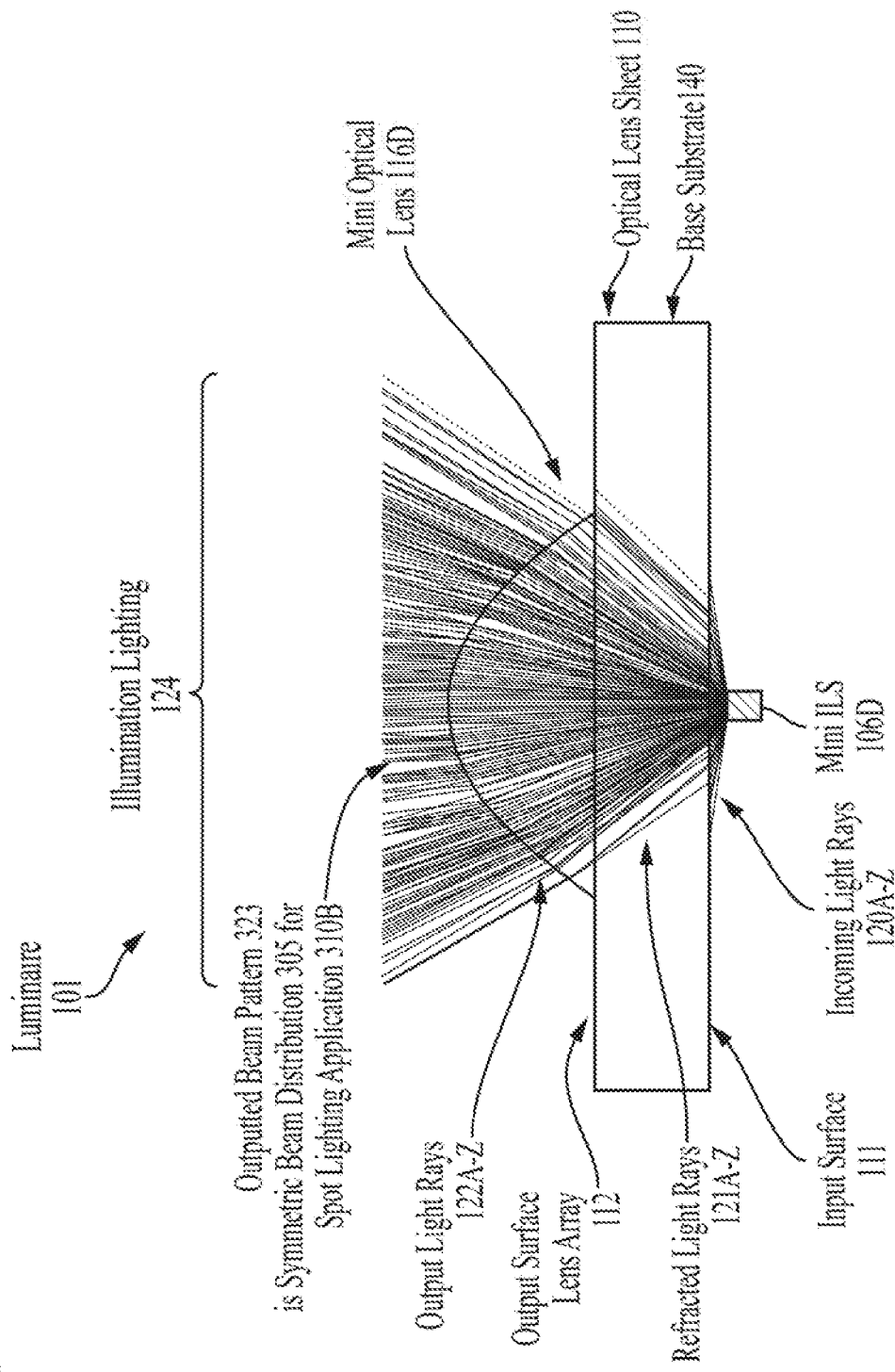
FIG. 3 is a cross-sectional view of a luminaire illustrating steering or shaping of incoming light rays through the optical lens sheet, including the base substrate and the output surface lens array for a spot lighting application.
Figure 4:
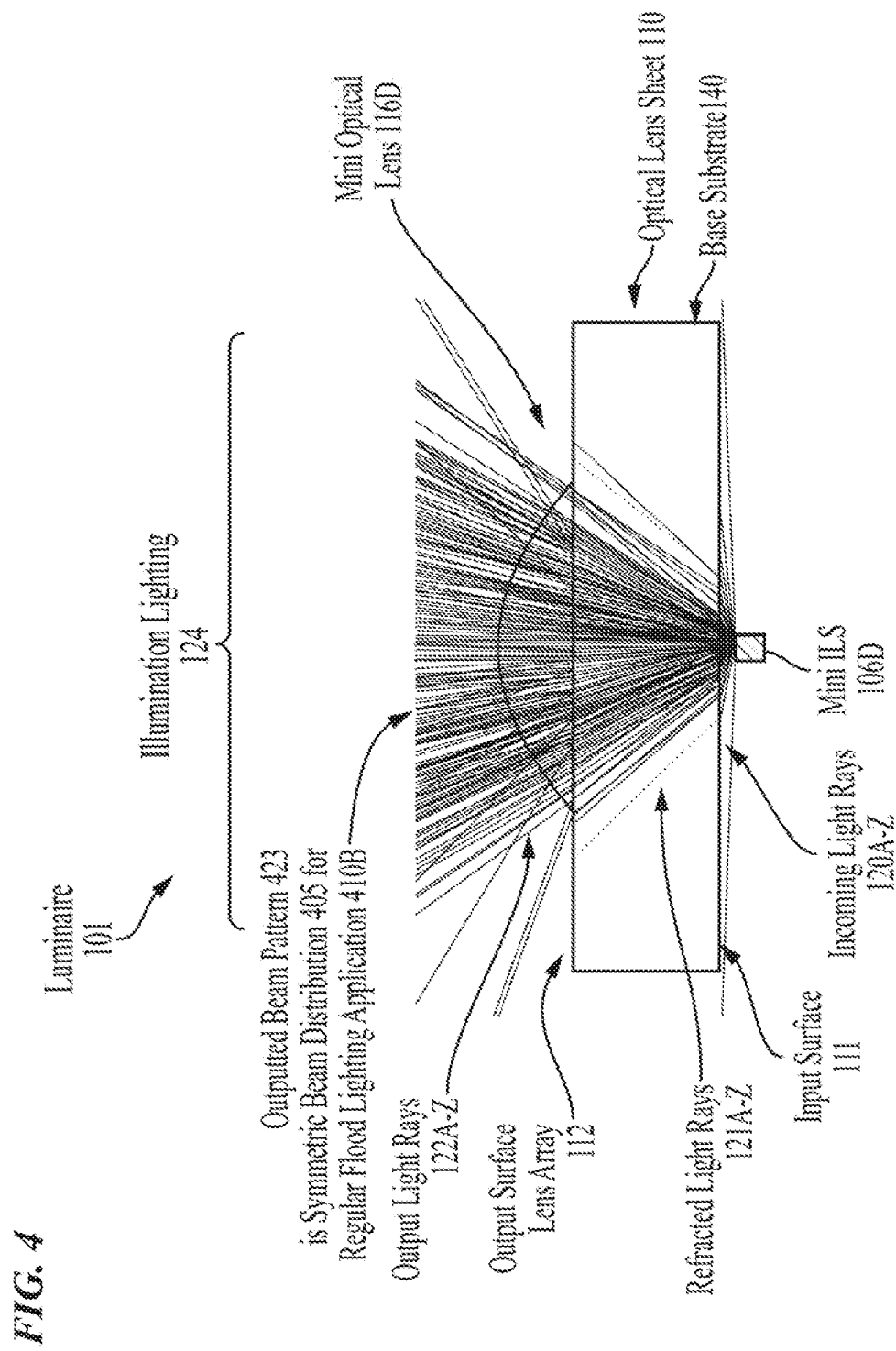
FIG. 4 is a cross-sectional view of a luminaire illustrating steering or shaping of incoming light rays through the optical lens sheet, including the base substrate and the output surface lens array for a regular flood lighting application.
Figure 5:
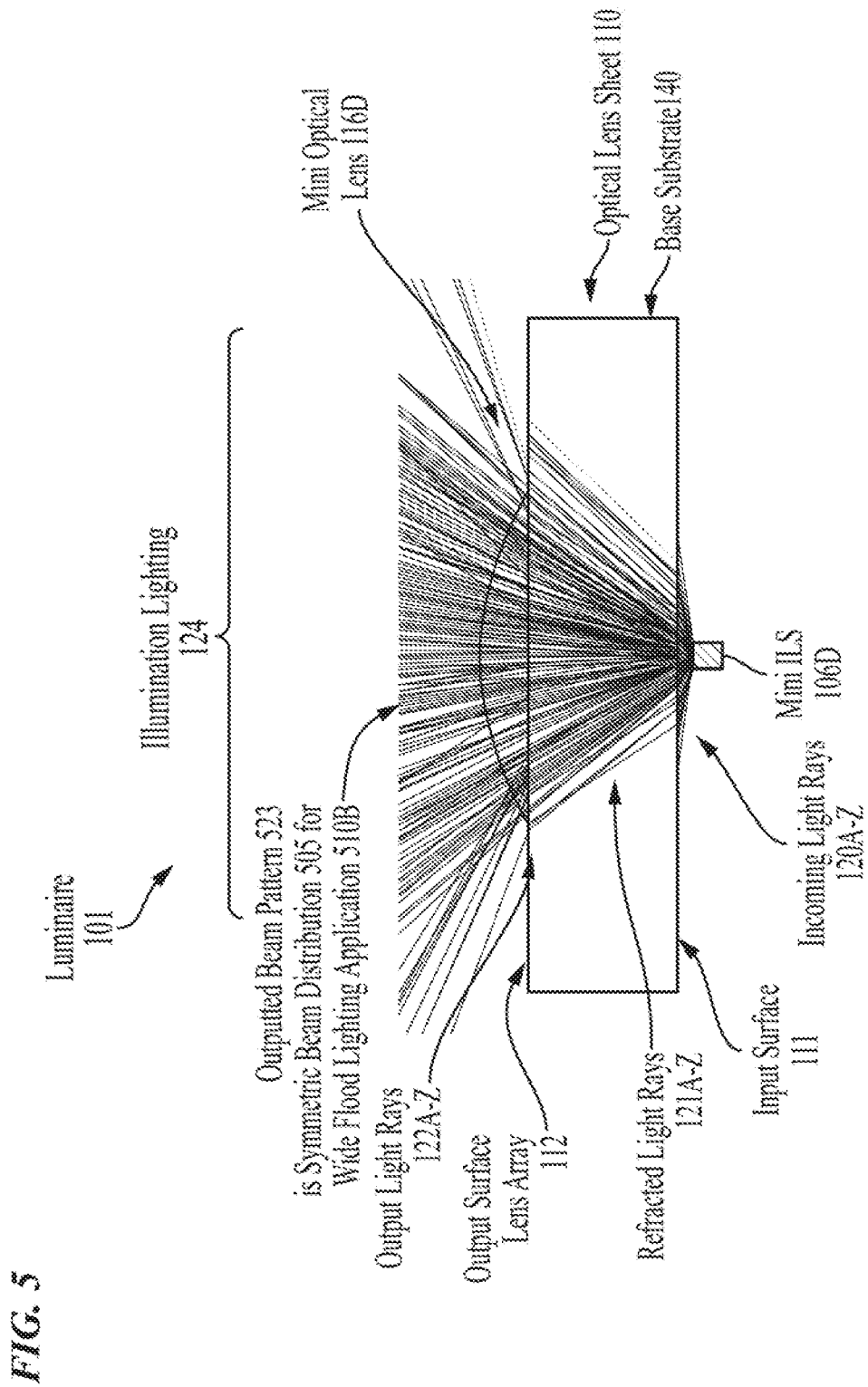
FIG. 5 is a cross-sectional view of a luminaire illustrating steering or shaping of incoming light rays through the optical lens sheet, including the base substrate and the output surface lens array for a wide flood lighting application.

In the example, the optical lens sheet 110 is positioned over the miniature illumination light sources 106A-Y to cover the miniature illumination light sources 106A-Y. Miniature illumination light sources 106A-Y are disposed on the lighting circuit board 103 and covered by the optical lens sheet 110, particularly the input surface 111. Optical lens sheet 110 may be formed of a solid material that can be light transmissive. In the luminaire 101, optical elements, specifically 25 miniature optical lenses 116A-Y are embedded in the optical lens sheet 110, which is a flat thin panel of optical grade material like poly methyl methacrylate (PMMA) known, also known as acrylic, acrylic glass, or plexiglass; silicon, polycarbonate, plastic, etc. Optical lens sheet 110 includes a base substrate 140, which appears as a lower layer upon that the output surface lens array 112 layered on, but integrally formed with to make up the optical lens sheet 110. Base substrate 140 includes an entrance surface, shown as input surface 111, to receive incoming light rays 120A-Z emitted by the miniature illumination light source 106D. Although not shown in FIGS. 2A-B, the incoming light rays 120A-Z undergo refraction upon entering the base substrate 140 of the optical lens sheet 110 and are converted into refracted light rays 121A-Z, as shown in FIGS. 3, 4, and 5.

At least three different lighting distributions can be achieved with the lighting device 100: (i) a batwing lighting distributions (wide/medium/narrow); (ii) focus/flood lighting distributions (wide/medium/narrow beam angles); and (iii) asymmetric lighting distributions (far/medium/near). Since the spacing between the miniature illumination light sources 106A-Y is approximately 3-5 mm, it is feasible to populate output surface lens arrays 112 with differently shaped miniature optical lenses 116A-Y in a relatively small and thin (e.g., 6 square inch) luminaire panel that may be as thin as 1 centimeter (cm). The luminaire panel includes both the optical lens sheet 110 and the lighting circuit board 103 with the miniature illumination light sources 106A-Y disposed thereon. By controlling the miniature illumination light sources 106A-Y (bright/dim, on/off), which can be randomly populated in a panel of the luminaire 101, it is feasible to dynamically change the beam patterns (steering, beam pattern increase/decrease, etc.) without dramatically changing the look of the panel of the luminaire 101. This is beneficial since the form factor of the luminaire 101 is smaller, which drives down manufacturing costs since less material is needed and the luminaire 101 is lighter in weight. The structure can be utilized, for example, to make a very thin luminaire 101 panel for a downlight installation.

Optical lens sheet 110 is a transmissive optical device that can focus or disperse incoming light beam rays utilizing refraction. Various materials can be used to form the optical lens sheet 110, such as acrylic, silicone, polycarbonate, glass, plastic, or a combination thereof. Different materials have different refractive indices, hence the geometry of the optical lens sheet 110 can be adjusted depending on the desired optical properties. Typically, the optical material to form the optical lens sheet 110 is optically clear with respect to the visible light wavelength. The optical lens sheet 110 can be formed of a single piece of transparent material or be a compound lens formed of several lens materials or elements arranged on a common axis. The materials forming the optical lens sheet 110 can be ground, and then molded or extruded to the desired shape and then polished, or injection molded. A diffuser surface can be added to the optical lens sheet 110 to help with color separation problem. For example, texture can be added to output surface lens array 112 by roughening up those portions to smooth out the light distribution as well as improve color mixing. Or an additional diffuser layer can be added above the optical lens sheet 110 in the lighting device 100 to smooth out the light distribution and reduce color separation. A diffuser eliminates striations in the projection of the illumination lighting to make the illumination lighting relatively smooth and can be utilized in the lighting device 100. In some examples, a separate diffuser can be included in the lighting device 100 for each of the miniature illumination light sources 106A-Y (e.g., one diffuser per miniature illumination light source 106A-Y). Or a single diffuser can be included in the entire lighting device 100 for all of the miniature illumination light sources 106A-Y and optical lens sheet 110.

For a Lambertian beam distribution, a diffuser may be needed to get rid of pixilation. But typically a diffuser is advantageously not needed because the size of the miniature illumination light sources 106A-Y is 0.2×0.2 mm or less in width (W) 132 and length 133 (L) resulting in a pitch (P) 136 that is typically around 2 mm or less, which means a panel of the luminaire 101 will appear pixilation free to a naked human eye. Diffusers are also disadvantageous because a narrow spot light application beam distribution may not be achievable with the diffuser and the diffuser adds weight to the luminaire 101. However, if the pitch 136 is 5 mm or more (e.g., with non-micro versions of illumination light sources), a diffuser is likely needed to remove pixilation because an observer walking by the luminaire 101 can directly see individual illumination light sources 106A-Y of the luminaire 101 with the naked human eye.

Optical lens sheet 110 may have a plurality of aspherical or spherical or freeform surfaces. The convex surfaces forming the 25 miniature optical lenses 116A-Y of the optical lens array 112 can refract the incoming light rays 120A-Z that pass through such that the incoming parallel light rays converge towards each other as shown in FIG. 3. As shown, the optical lens sheet 110 includes an input surface 111 and an output surface lens array 112. The input surface 111 and output surface lens array 112 can each include various surface portions with different shapes, sometimes convex, flat, or concave to achieve different optical distributions and beam angles. As shown in the examples of FIGS. 2A-B, the input surface 111 is a substantially planar lateral surface 112 and is coupled to the illumination light sources 106A-Y with a small air gap to provide a relatively thin luminaire panel. The air gap between the substantially planar lateral surface 112 and the illumination light sources 106A-Y is typically needed to create a refractive index to change the light cone, which is based on the air gap. The air gap is made as small as possible to effectively allow changing of the light cone, typically the air gap is 0.05 mm to 0.2 mm, for example, 0.1 mm. The input surface 111 may form a light source opening (e.g., the air gap) to cover and collect light output from the miniature illumination light sources 106A-Y if having a somewhat thicker luminaire panel is suitable. Whether the entire structure of the miniature illumination light sources 106A-Y are inside the light source opening or just the top surface of the miniature illumination light sources 106A-Y depends on the lighting distribution requirements.

The miniature optical lenses 116D-E of the optical lens array 112 are shown in FIGS. 2A-B with a cross-section profile shaped like a half of an oval. The shape of each of the miniature optical lenses 116A-Y can be circular, square, rotated with facets like a polygon, etc. In the examples, each of the miniature optical lenses 116A-Y are actually a convex surface as further shown in FIGS. 6A, 7A, 8A, 9A, and 10A with an aspherical or spherical shape or freeform shape (e.g., with a conic section curve). Conic section curves are made by a plane intersecting a cone, and common conic sections include a parabola, hyperbola, ellipse, sphere, etc. Conic sections can be rotated in three-dimensional space to form aspherical or spherical portions with a conical surface, such as a paraboloid, hyperboloid, ellipsoid, oblate ellipsoid, spheroid, etc., which may be truncated (e.g., partial).

Although not shown, optical lens sheet 110 may include a supporting mechanical structure (e.g., legs) coupled to the lighting circuit board 103 that do not have an optical function. Ways to attach the optical lens sheet 110 to the lighting circuit board 103 can include a press pin fit, glue, or double side tape. In some examples, spacer beads can be utilized for fastening the optical lens sheet 110 the lighting circuit board 103.

Optical lens sheet 110 controls beam shaping and steering from incoming light rays 120A-Z. Incoming light rays 120A-Z for illumination lighting 124 emitted by the miniature illumination light sources 106D first pass through the input surface 111 of the base substrate 140 where the incoming light rays 121A-Z undergo refraction and are converted into refracted light rays 121A-Z to shape or steer the illumination lighting 124. After passing through the input surface 111, the refracted light rays 121A-Z, (see FIGS. 3, 4, and 5), then pass through the output surface lens array 112 where the refracted light rays 121A-Z undergo further refraction to shape or steer the illumination lighting 124.

Referring now more specifically to FIG. 2A, a lighting device 100 includes a luminaire 101. The luminaire 101 includes a miniature illumination light source matrix 105 including miniature illumination light sources 106A-Y configured to be driven by electrical power to emit incoming light rays 120A-Z for illumination lighting 124. The luminaire 101 further includes an optical lens sheet 110 positioned directly over and abutting the miniature illumination light source matrix 105 and configured to extend over the illumination light source matrix 105. The optical lens sheet 110 further includes an input surface 111 coupled to receive the incoming light rays 120A-Z emitted by the miniature illumination light sources 106A-Y and an output surface lens array 112. The input surface 111 is a substantially planar lateral surface 102 extending across an entirety of the miniature illumination light source matrix 105, for example, spanning all of miniature illumination light sources rows 107A-E and miniature illumination light sources columns 108A-E. The output surface lens array 112 includes a plurality of miniature optical lenses 116A-Y, including a respective miniature optical lens 116A-Y for each respective one of the miniature illumination light sources 106A-Y to refract the incoming light rays 120A-Z from the respective miniature illumination light source 106A-Y into a portion of an outputted beam pattern (e.g., 323 shown in FIG. 3) of output light rays 122A-Z for the illumination lighting 124. The lighting device 100 further includes an illumination light source driver 1113 (FIG. 11) coupled to the miniature illumination light source matrix 105 of the luminaire 101 to selectively control the miniature illumination light sources 106A-Y in the miniature illumination light source matrix 105 to emit the incoming light rays 120A-Z received by the input surface 111 of the optical lens sheet 110 to adjust the outputted beam pattern (e.g., 323 shown in FIG. 3) of the output light rays 122A-Z from the optical lens sheet 110.

As shown in FIG. 2A, incoming light rays 120A-B for illumination lighting emitted by at least one of the miniature illumination light sources 106D first pass through the input surface 111 where the incoming light rays 120A-B undergo refraction to shape or steer the illumination lighting (e.g., 124 shown in FIG. 3). After passing through the input surface 111, the refracted light rays 121A-Z then pass through the respective miniature optical lens 116D where the refracted light rays 121A-Z undergo further refraction to shape or steer the illumination lighting 124 into output light rays 122A-Z of the outputted beam pattern (e.g., 323 shown in FIG. 8A). The output light rays 122A-Z of the outputted beam pattern 123 can selectively form a symmetric beam distribution (e.g., 305 shown in FIGS. 3 and 8A-B) or an asymmetric beam distribution (e.g., 605 in FIGS. 6A-B).

Although not drawn to scale, it should be understood that a thickness (T) 131 of the optical lens sheet 110 is at least five times greater than a largest dimension (e.g., width 132, length 133, and height 134) of each of the miniature illumination light sources 106A-Y. In one example, the optical lens sheet 110 is formed of acrylic with a refractive index (n) of 1.49. The pitch (P) 136 between the respective miniature optical lens 116A-Y for each of the miniature illumination light sources 106A-Y equals at least ten times the largest dimension of each of the miniature illumination light sources 106A-Y. The respective miniature optical lens 116A-Y for each of the miniature illumination light sources 106A-Y is an aspherical, spherical, or freeform shaped surface. The pitch (P) 136 is a diameter of 2 millimeters or less.

In an example, each of the miniature illumination light sources 106A-Y are a cuboid with a length dimension (L)

133 of 150 micrometers (0.15 mm) or less, a width dimension (W) 132 of 150 micrometers (0.15 mm) or less, and a height dimension (H) 134 of 150 micrometers (0.15 mm) micrometers or less. Alternatively, the length dimension (L) 133 is 200 micrometers (0.2 mm) or less, the width dimension (W) 132 is 200 micrometers (0.2 mm) or less, and the height dimension (H) 134 is 200 micrometers (0.2 mm) or less. A pitch (P) 136 between the respective miniature optics lens 116A-Y for each of the miniature illumination light sources 106A-Y is 2 millimeters (mm) or less. Alternatively, the pitch (P) 136 is 3 mm or less. A thickness (T) 131 of the optical lens sheet is 1 mm or less. Alternatively, the thickness (T) 131 is 2 mm or less.

In a first example, a thickness (T) 131 of the optical lens sheet 110 is 0.75 millimeters or less for a spot lighting application and the miniature optical lenses 116A-Y of the output surface lens array 112 refract the incoming light rays 120A-Z passing through to shape or steer the illumination lighting 124 into the output light rays 122A-Z of the outputted beam pattern for the spot lighting application. In a second example, a thickness (T) 131 of the optical lens sheet 110 is 1 millimeter or less for a flood lighting application. The miniature optical lenses 116A-Y of the output surface lens array 112 refract the incoming light rays 120A-Z passing through to shape or steer the illumination lighting 124 into the output light rays 122A-Z of the outputted beam pattern for the flood lighting application. In a third example, a thickness (T) 131 of the optical lens sheet 110 is 1.1 millimeters or less for a diffuse lighting application. The miniature optical lenses 116A-Y of the output surface lens array 112 refract the incoming light rays 120A-Z passing through to shape or steer the illumination lighting 124 into the output light rays 122A-Z of the outputted beam pattern for the diffuse lighting application.

Referring now more specifically to FIG. 2B, a lighting device 100 includes a luminaire 101. The luminaire 101 includes a miniature illumination light source matrix 105 including miniature illumination light sources 106A-Y configured to be driven by electrical power to emit incoming light rays 120A-Z for illumination lighting 124. The luminaire 10 further includes an optical lens sheet 110 positioned directly over and abutting the miniature illumination light source matrix 105 and configured to extend over the illumination light source matrix 105 and including an input surface 111 coupled to receive the incoming light rays 120A-Z emitted by the miniature illumination light sources 106A-Y and an output surface lens array 112. The input surface 111 has for each of the miniature illumination light sources 106A-Y, a respective substantially planar lateral surface 102A-Y and a respective recessed wall 118A-Y to create a respective recess 117A-Y with a total internal reflection (TIR) contour that totally internal reflects the incoming light rays 120A-C from a respective miniature illumination light source 106A-Y into refracted TIR light rays 125A-C.

The output surface lens array 112 includes a plurality of miniature optical lenses 116A-Y, including a respective miniature optical lens 116A-Y for each respective one of the miniature illumination light sources 106A-Y to refract the refracted TIR light rays 125A-C from the respective miniature illumination light source 106A-Y into a portion of an outputted beam pattern of output light rays 122A-Z for the illumination lighting 124. The lighting device 100 further includes an illumination light source driver (1113 shown in FIG. 11) coupled to the miniature illumination light source matrix 105 of the luminaire 101 to selectively control the miniature illumination light sources 106A-Y in the miniature illumination light source matrix 105 to emit the incoming light rays 120A-Z received by the input surface 111 of the optical lens sheet 110 to adjust the outputted beam pattern of the output light rays 122A-Z from the optical lens sheet 110.

In FIG. 2B, the respective recessed wall 118A-Y is a flat or curved indentation of the input surface 111 that extends in at least a longitudinal direction, a lateral direction, or a combination thereof to form the respective recess 117A-Y. The respective recess 117A-Y is a cavity that is an air pocket in the input surface 111. FIG. 2B is air gapped to achieve an asymmetric beam distribution. In both FIGS. 2A-B an air gap is formed between the illumination light sources 106A-Y and the substantially planar lateral surface 102, 102A-Y. However, in FIG. 2B, the air pocket in the input surface 111 is for total internal reflection (TIR) to achieve an asymmetric beam distribution. Incoming light rays 120A-Z for illumination lighting 124 emitted by at least one of the miniature illumination light sources 106A-Y first pass through the respective substantially planar lateral surface 102A-Y where the incoming light rays 120A-Z undergo refraction to shape or steer the illumination lighting 124. After passing through the input surface 111, a subset 120A-C of the refracted incoming light rays 120A-Z then strike the respective recessed (e.g., longitudinal) wall 118A-Y where the subset 120A-C of the refracted incoming light rays 120A-Z undergo total internal reflection (TIR) to become refracted TIR light rays 125A-C to further shape or steer the illumination lighting 124. After striking the respective recessed wall 118-Y, the refracted TIR light rays 125A-C pass through the respective miniature optical lens 116A-Y to undergo further refraction to further shape or steer the illumination lighting 124 into output light rays 122A-Z of the outputted beam pattern. The outputted beam pattern has an asymmetric beam distribution. Hence, the TIR contour of the respective recessed (e.g., longitudinal) wall 118A-Y creates asymmetric beam distributions.

With respect to FIG. 2B, incoming light rays 120A-Z for illumination lighting 124 emitted by the miniature illumination light sources 106D first pass through the input surface 111 of the base substrate 140 where the incoming light rays 120A-Z undergo refraction and are converted into refracted light rays 121A-Z to shape or steer the illumination lighting 124. After passing through the input surface 111, a subset of the refracted incoming light rays 121A-C strike (e.g., hit) a recessed wall 118D (which behaves as a TIR lens) and undergo total internal reflection (TIR) and are converted into refracted TIR light rays 125A-C. Since refracted incoming light rays 121A-C are travelling at an angle of incidence larger than the critical angle for refraction, refracted incoming light rays 121A-C are reflected off the recessed wall 118D (which is substantially planar in the example, but can be a curved surface), which obeys the law of reflection. The refracted TIR light rays 125A-C and refracted light rays 121D-Z then pass through the output surface lens array 112 to undergo further refraction to shape or steer the illumination lighting 124. In one example, the shaping or steering provides for adjusting parameters of the illumination lighting (e.g. intensity, or distribution, direction of the optic, output light pattern, beam shape). The multiple miniature illumination light sources 106A-Y under the optical lens sheet 110 can be selectively turned on/off to control beam shape, for example.

FIG. 3 is a cross-sectional view of a luminaire 101 illustrating steering or shaping of incoming light rays 120A-Z through the optical lens sheet 110, including the base substrate 140 and the output surface lens array 112 for a spot lighting application 310B. In the example of FIG. 3, the pitch (P) 136 is 2 millimeters (mm); the width (W) 132 and length (L) 133 of the miniature illumination light source 106D is 0.15 µm×0.15 µm, respectively; and the thickness 131 of the base substrate 140 of the optical lens sheet 110 is 0.67 mm. Only the miniature illumination light source 106D is fully turned on to drive the luminaire 101 of the lighting device 100. Traces of several incoming light rays 120A-Z emitted by the miniature illumination light source 106D through the surfaces, such as the input surface 111 of the base substrate 140 and the output surface lens array 112, of the optical lens sheet 110 are depicted.

Figure 8A:
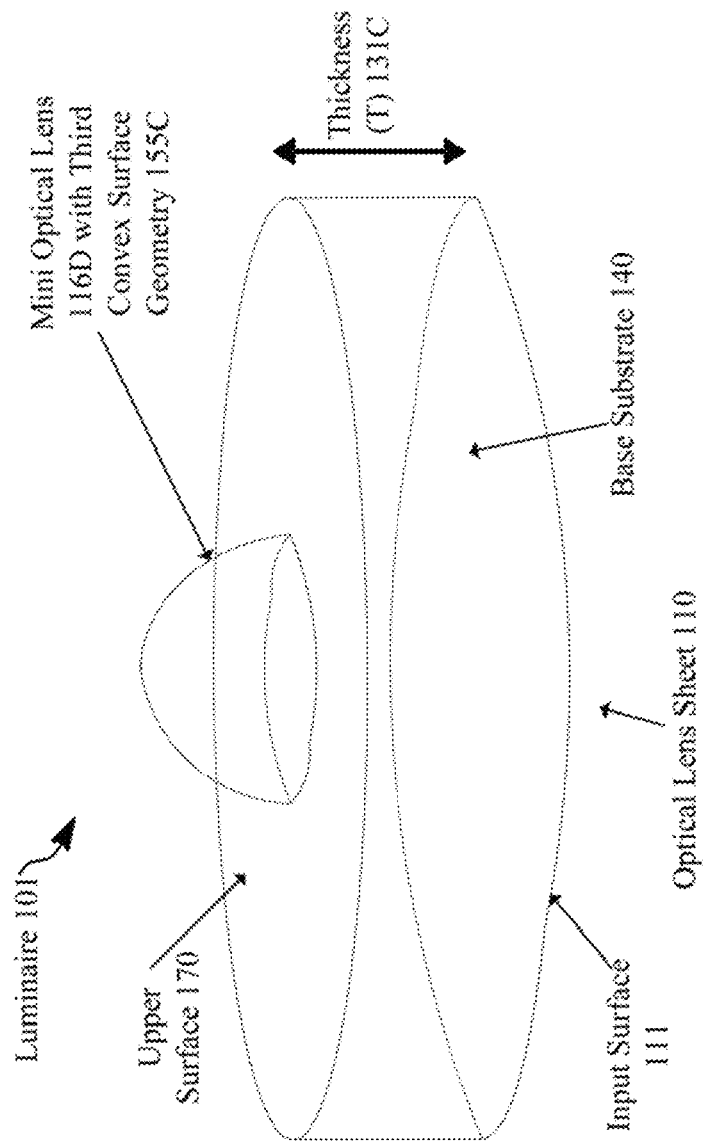
FIG. 8A depicts an isometric view of a section of the luminaire of FIG. 3 showing the design of the optical lens sheet to cover the single miniature illumination light source with the miniature optical lens having a third convex surface geometry and the base substrate having a third thickness.
Figure 8B:
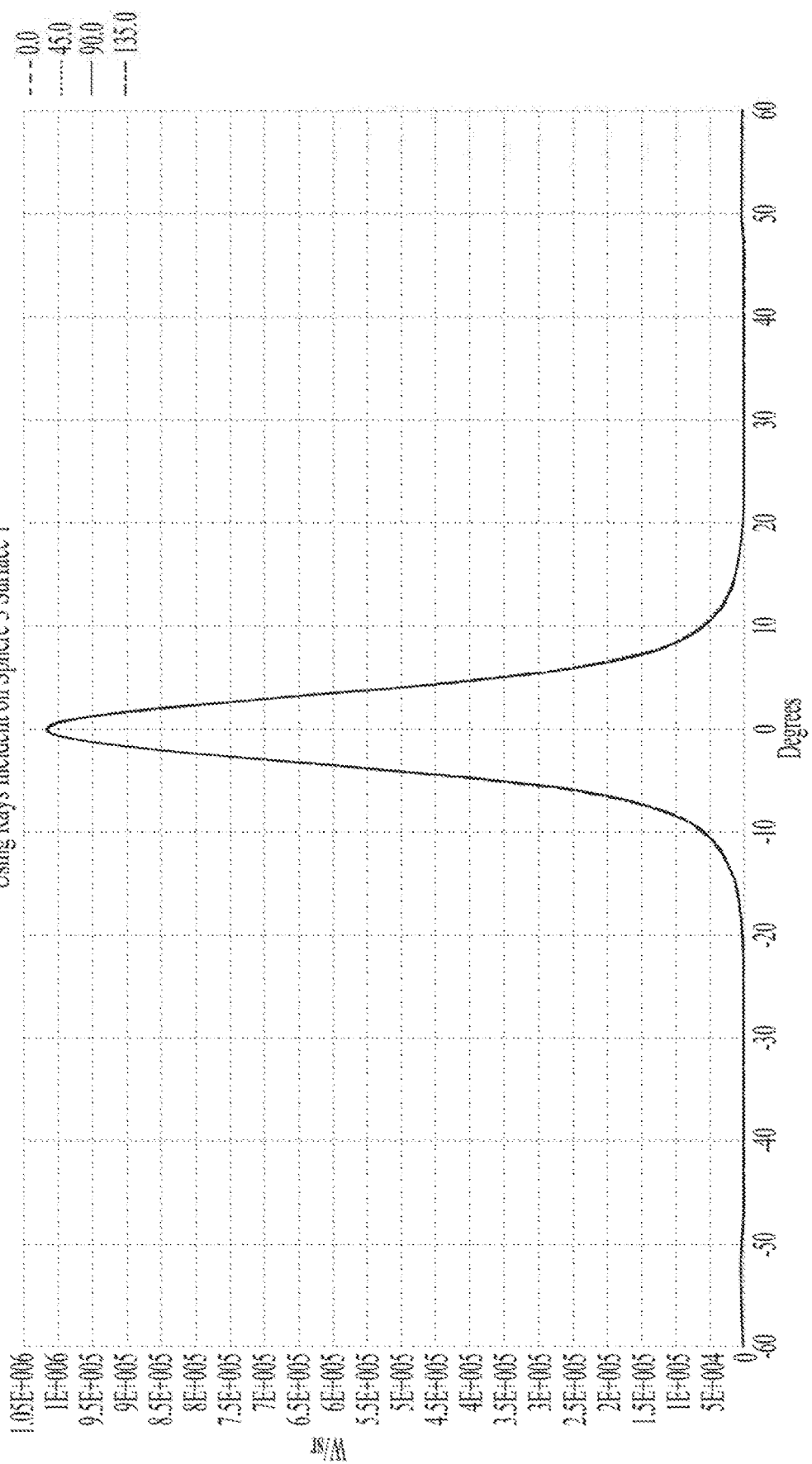
FIG. 8B is a candela distribution plot of the outputted beam pattern of FIGS. 3 and 8A with the optical lens sheet designed with the third convex surface geometry and the third thickness.

Initially, incoming light rays 120A-Z emitted by the miniature illumination light source 106D first pass through the input surface 111 of the base substrate 140 of the optical lens sheet 110 upon which the incoming light rays 120A-Z undergo refraction and are converted into refracted light rays 121A-Z. Next, the refracted light rays 121A-Z pass through the miniature optical lens 116D of the optical lens array 112 and undergo further refraction and are converted into output light rays 122A-Z to form the outputted beam pattern 323 of the illumination lighting 124. The optical lens sheet 110 narrows the lighting beam distribution 305 for the depicted miniature illumination light source 106D into a beam angle of 12° for the spot lighting application 310B. As shown, the lighting beam distribution 305 is symmetric. In FIGS. 3 and 8A-B, because the thickness (T) 131 of the base substrate 140 is thinner and the miniature optical lens 116D is a more convex shape (bulges outward more with a greater convex slope) in FIG. 3 compared to FIGS. 4, 9A-B, 5, and 10A-B, the spot lighting application 310B is achieved.

FIG. 4 is a cross-sectional view of a luminaire 101 illustrating steering or shaping of incoming light rays 120A-Z through the optical lens sheet 110, including the base substrate 140 and the output surface lens array 112 for a regular flood lighting application 410B. In the example of FIG. 4, the pitch (P) 136 is 2 millimeters (mm); the width (W) 132 and length (L) 133 of the miniature illumination light source 106D is 0.15 µm×0.15 µm, respectively; and the thickness 131 of the base substrate 140 of the optical lens sheet 110 is 1 mm. Only the miniature illumination light source 106D is fully turned on to drive the luminaire 101 of the lighting device 100. Traces of several incoming light rays 120A-Z emitted by the miniature illumination light source 106D through the surfaces, such as the input surface 111 of the base substrate 140 and the output surface lens array 112, of the optical lens sheet 110 are depicted.

Figure 9A:
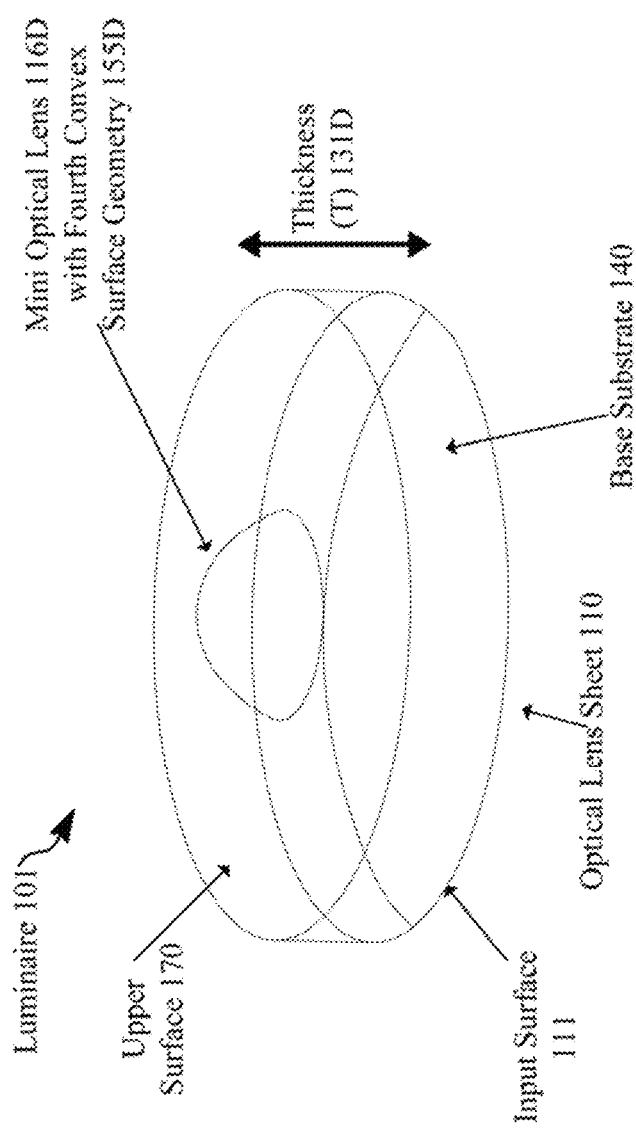
FIG. 9A depicts an isometric view of a section of the luminaire of FIG. 4 showing the design of the optical lens sheet to cover the single miniature illumination light source with the miniature optical lens having a fourth convex surface geometry and the base substrate having a fourth thickness.
Figure 9B:
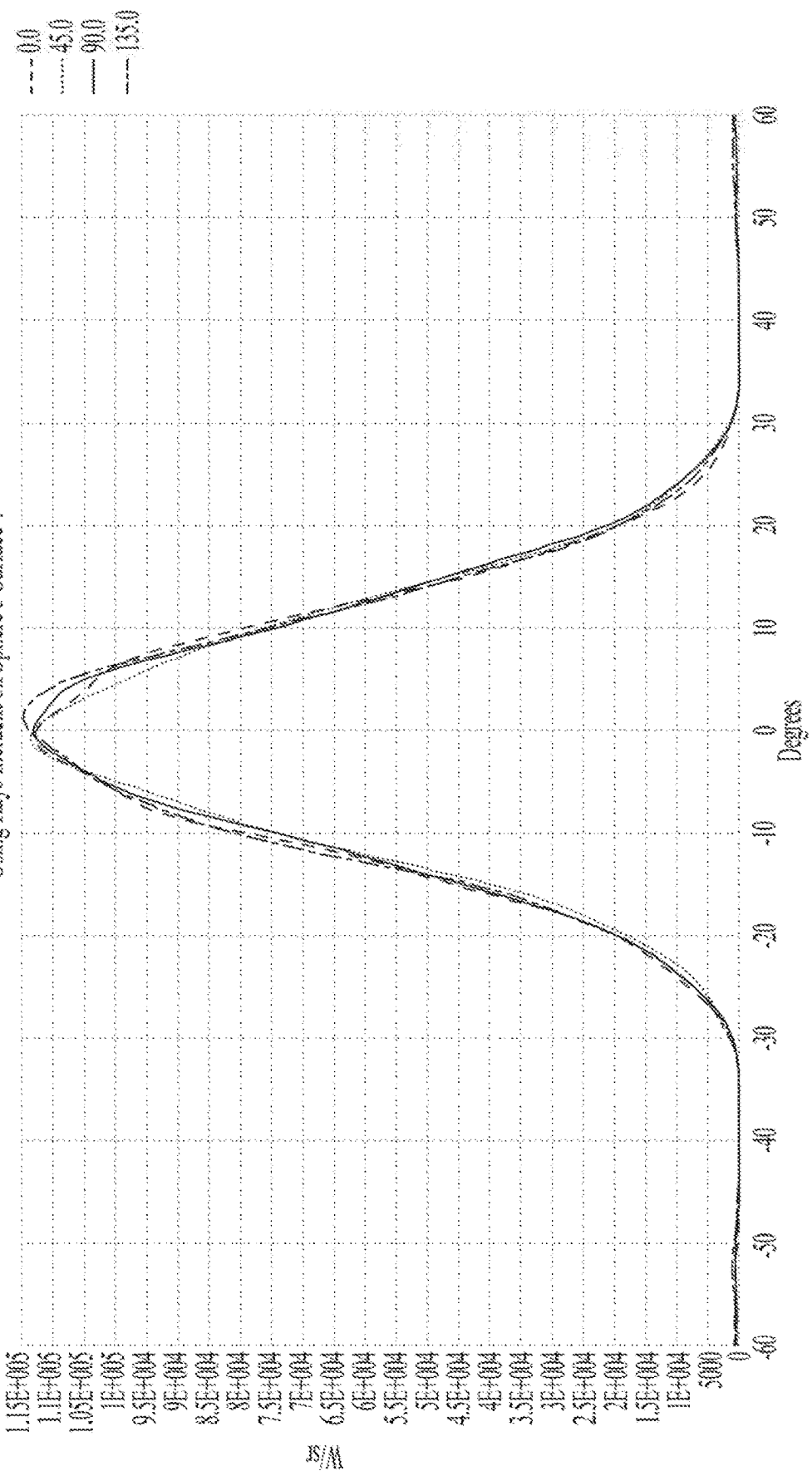
FIG. 9B is a candela distribution plot of the outputted beam pattern of FIGS. 4 and 9A with the optical lens sheet designed with the fourth convex surface geometry and the fourth thickness.

Initially, incoming light rays 120A-Z emitted by the miniature illumination light source 106D first pass through the input surface 111 of the base substrate 140 of the optical lens sheet 110 upon which the incoming light rays 120A-Z undergo refraction and are converted into refracted light rays 121A-Z. Next, the refracted light rays 121A-Z pass through the miniature optical lens 116D of the optical lens array 112 and undergo further refraction and are converted into output light rays 122A-Z to form the outputted beam pattern 423 of the illumination lighting 124. The optical lens sheet 110 narrows the lighting beam distribution 405 for the depicted miniature illumination light source 106D into a beam angle of 40° for the regular flood lighting application 410B. As shown, the lighting beam distribution 405 is symmetric. In FIG. 4, because the thickness (T) 131 of the base substrate 140 is thicker and the miniature optical lens 116D is a less convex shape (bulges outward less with a reduced convex slope) in FIGS. 4 and 9A-B compared to FIGS. 3 and 8A-B, the regular flood lighting application 410B is achieved. Although the thickness (T) 131 of the base substrate 140 is the same in FIG. 4 and FIG. 5, the miniature optical lens 116D is a more convex shape (bulges outward more with a greater convex slope) in FIG. 4 compared to FIG. 5, which creates a narrower beam angle than FIG. 5.

FIG. 5 is a cross-sectional view of a luminaire 101 illustrating steering or shaping of incoming light rays 120A-Z through the optical lens sheet 110, including the base substrate 140 and the output surface lens array 112 for a wide flood lighting application 510B. In the example of FIG. 5, the pitch (P) 136 is 2 millimeters (mm); the width (W) 132 and length (L) 133 of the miniature illumination light source 106D is 0.15 µm×0.15 µm, respectively; and the thickness 131 of the base substrate 140 of the optical lens sheet 110 is 1 mm. Only the miniature illumination light source 106D is fully turned on to drive the luminaire 101 of the lighting device 100. Traces of several incoming light rays 120A-Z emitted by the miniature illumination light source 106D through the surfaces, such as the input surface 111 of the base substrate 140 and the output surface lens array 112, of the optical lens sheet 110 are depicted.

Figure 10A:
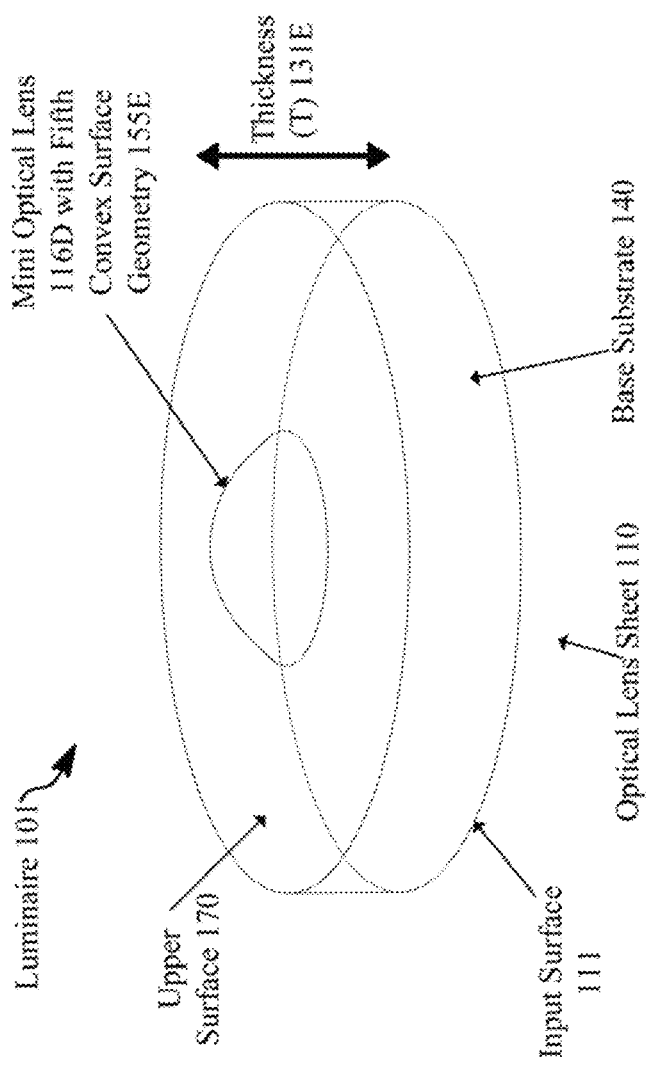
FIG. 10A depicts an isometric view of a section of the luminaire of FIG. 5 showing the design of the optical lens sheet to cover the single miniature illumination light source with the miniature optical lens having a fifth convex surface geometry and the base substrate having a fifth thickness.
Figure 10B:
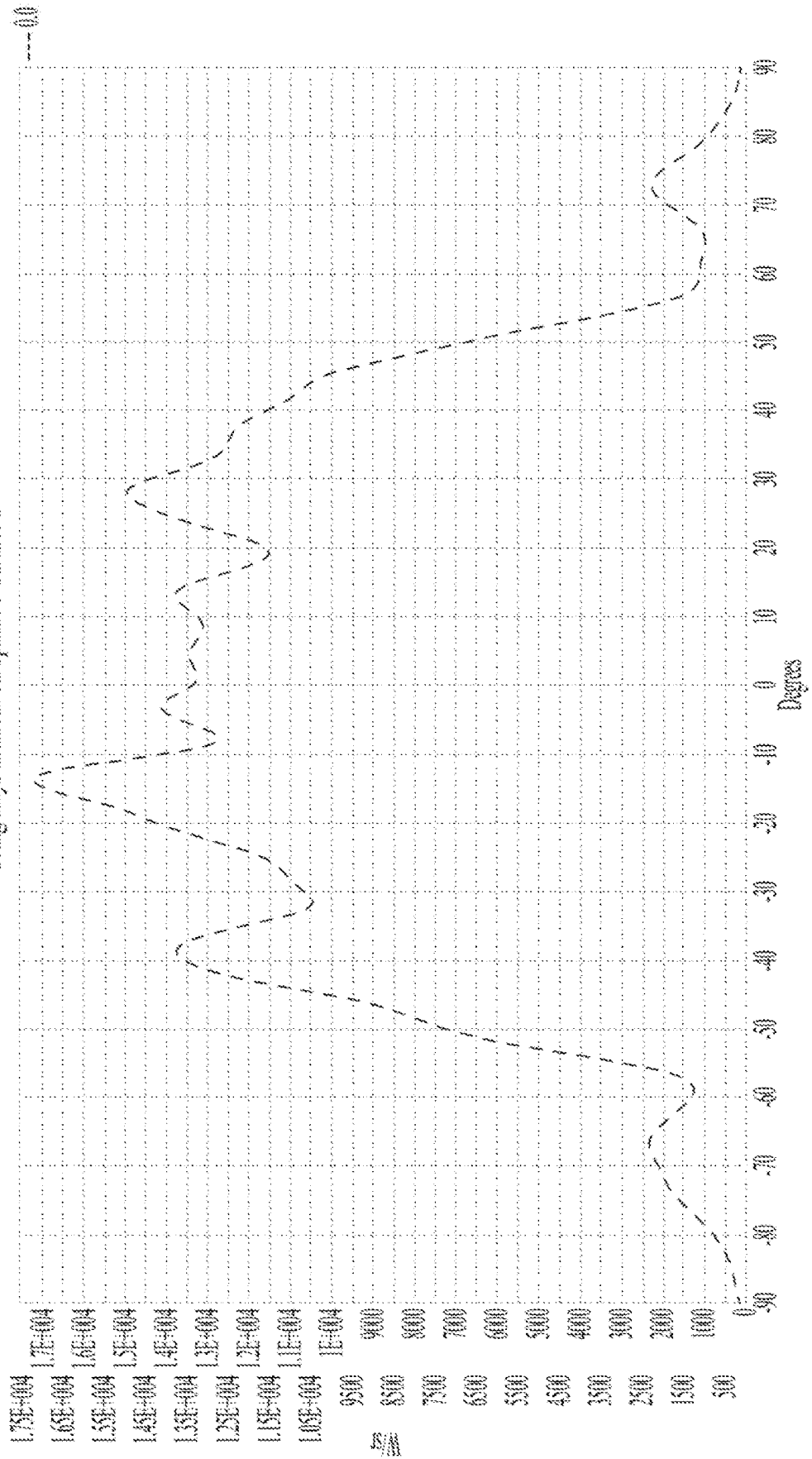
FIG. 10B is a candela distribution plot of the outputted beam pattern of FIGS. 5 and 10A with the optical lens sheet designed with the fifth convex surface geometry and the fifth thickness.

Initially, incoming light rays 120A-Z emitted by the miniature illumination light source 106D first pass through the input surface 111 of the base substrate 140 of the optical lens sheet 110 upon which the incoming light rays 120A-Z undergo refraction and are converted into refracted light rays 121A-Z. Next, the refracted light rays 121A-Z pass through the miniature optical lens 116D of the optical lens array 112 and undergo further refraction and are converted into output light rays 122A-Z to form the outputted beam pattern 523 of the illumination lighting 124. The optical lens sheet 110 narrows the lighting beam distribution 505 for the depicted miniature illumination light source 106D into a beam angle of 40° for the regular flood lighting application 510B. As shown, the lighting beam distribution 505 is symmetric. In FIGS. 5 and 10A-B, because the thickness (T) 131 of the base substrate 140 is thicker and the miniature optical lens 116D is a less convex shape (bulges outward less with a reduced convex slope) in FIG. 5 compared to FIGS. 3 and 8A-B, the regular flood lighting application 410B is achieved. Although the thickness (T) 131 of the base substrate 140 is the same in both FIG. 5 and FIG. 4, the miniature optical lens 116D is a less convex shape (bulges outward less with a lesser convex slope) in FIG. 5 compared to FIG. 4, which creates a wider beam angle in FIG. 5.

Figure 6A:
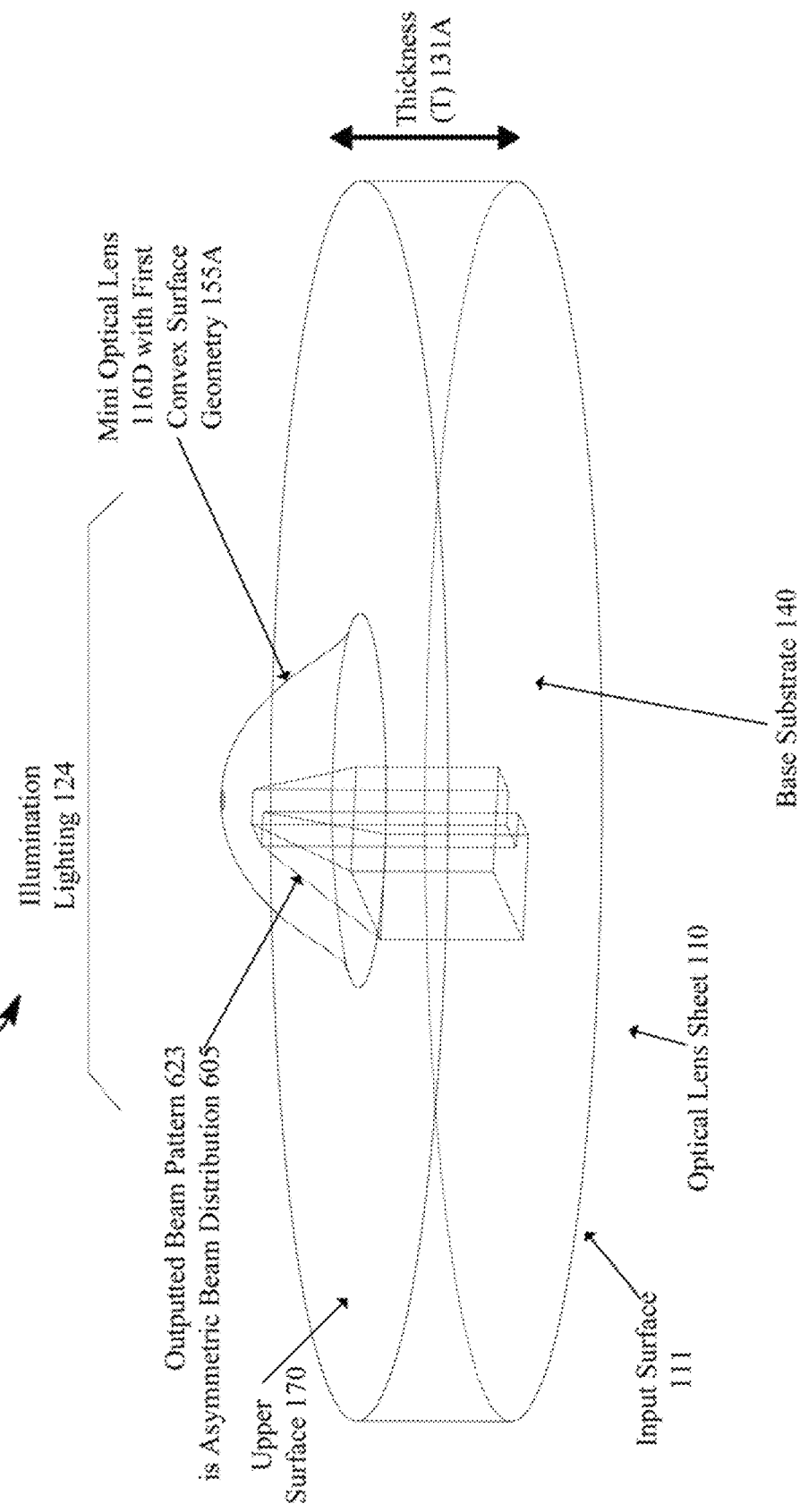
FIG. 6A depicts an isometric view of a section of the luminaire showing the design of the optical lens sheet to cover the single miniature illumination light source with the miniature optical lens having a first convex surface geometry and the base substrate having a first thickness.
Figure 6B:
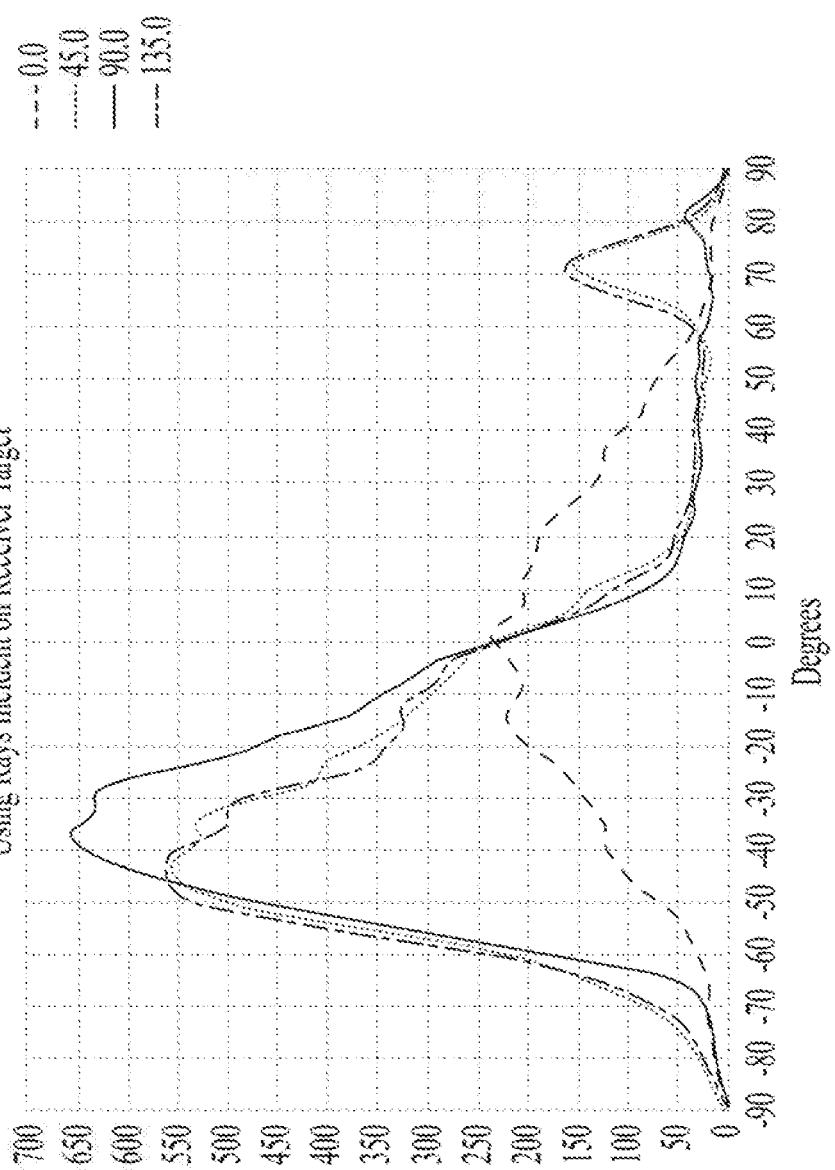
FIG. 6B is a candela distribution plot of the outputted beam pattern of FIG. 6A with the optical lens sheet designed with the first convex surface geometry and the first thickness.

FIG. 6A depicts an isometric view of a section of the luminaire 101 showing the design of the optical lens sheet 110 to cover the single miniature illumination light source 106D with the miniature optical lens 116D having a first convex surface geometry 155A and the base substrate 140 having a first thickness 131A. As shown, the design of the optical lens sheet 110 with the first convex surface geometry 155A and the first thickness 131A achieves an outputted beam pattern 623 that is an asymmetric beam distribution 605. FIG. 6B is a candela distribution plot 600B of the outputted beam pattern 623 of FIG. 6A with the optical lens sheet 110 designed with the first convex surface geometry 155A and the first thickness 131A.

Figure 7A:
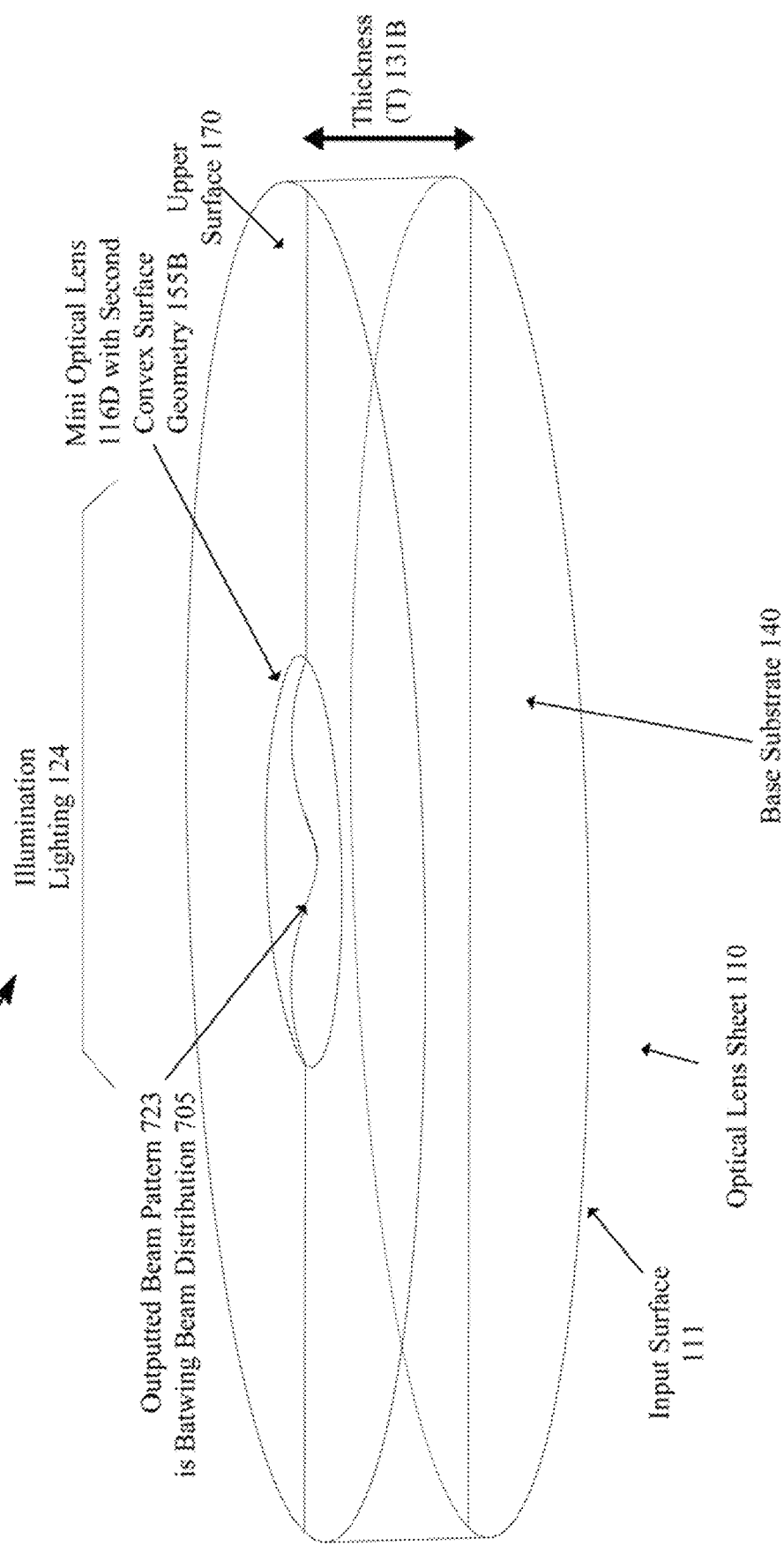
FIG. 7A depicts an isometric view of a section of the luminaire showing the design of the optical lens sheet to cover the single miniature illumination light source with the miniature optical lens having a second convex surface geometry and the base substrate having a second thickness.
Figure 7B:
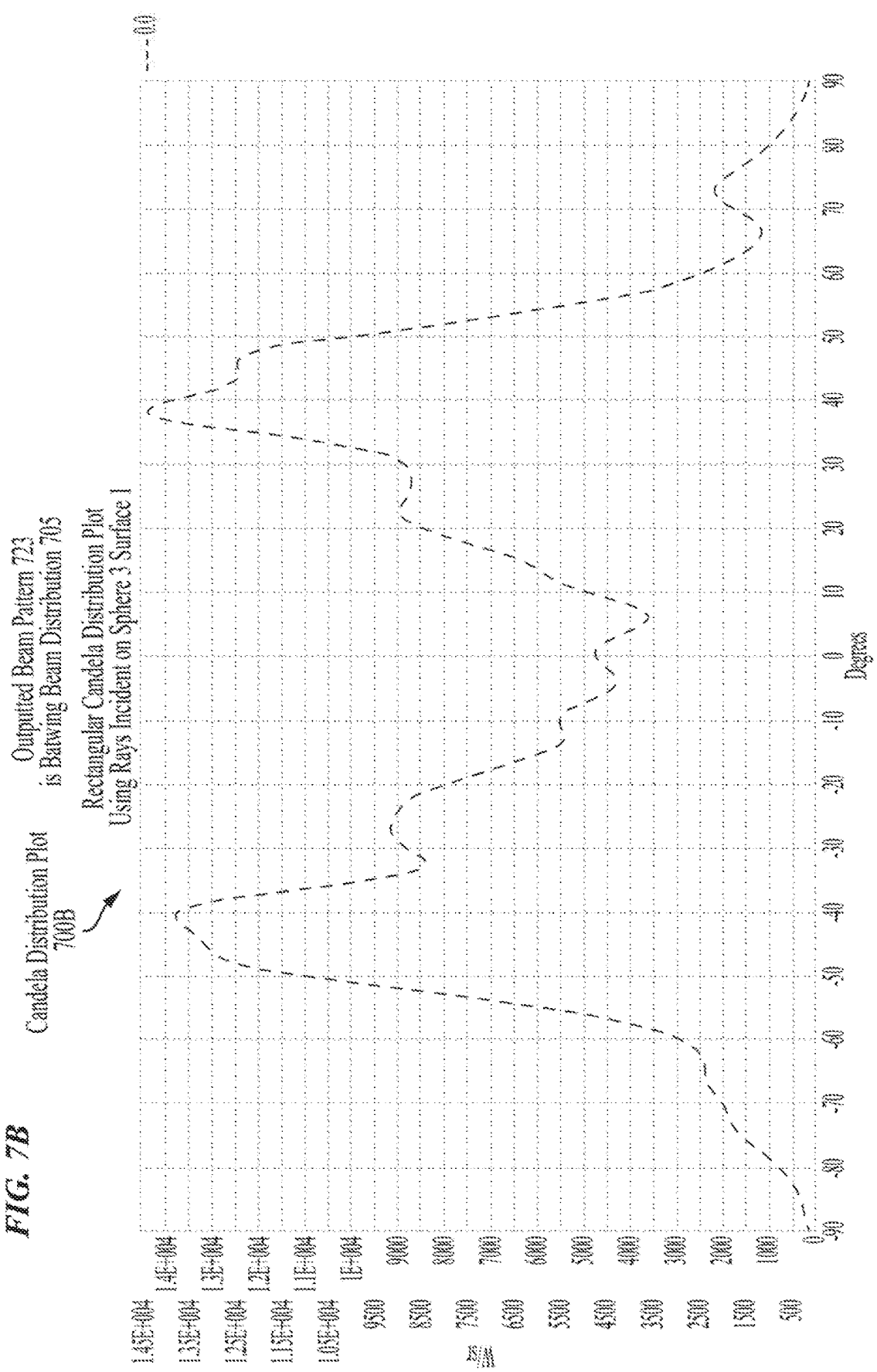
FIG. 7B is a candela distribution plot of the outputted beam pattern of FIG. 7A with the optical lens sheet designed with the second convex surface geometry and the second thickness.

FIG. 7A depicts an isometric view of a section of the luminaire 101 showing the design of the optical lens sheet 110 to cover the single miniature illumination light source 106D with the miniature optical lens 116D having a second convex surface geometry 155B and the base substrate 140 having a second thickness 131B. As shown, the design of the optical lens sheet 110 with the second convex surface geometry 155B and the second thickness 131B achieves an outputted beam pattern 723 that is a batwing beam distribution 705. FIG. 7B is a candela distribution plot 700B of the outputted beam pattern 723 of FIG. 7A with the optical lens sheet 110 designed with the second convex surface geometry 155B and the second thickness 131B.

FIG. 8A depicts an isometric view of a section of the luminaire 101 of FIG. 3 showing the design of the optical lens sheet 110 to cover the single miniature illumination light source 106D with the miniature optical lens 116D having a third convex surface geometry 155C and the base substrate 140 having a third thickness 131C. FIG. 8B is a candela distribution plot 800B of the outputted beam pattern 823 of FIGS. 3 and 8A with the optical lens sheet 110 designed with the third convex surface geometry 155C and the third thickness 131C. As shown, the design of the optical lens sheet 110 with the third convex surface geometry 155C and the third thickness 131C achieves the outputted beam pattern 323 that is a narrow symmetric beam distribution 305 for a spot lighting application 310B like that shown in FIG. 3.

The candela distribution plot 800B is achieved utilizing the same lighting device 100 setup of FIGS. 3 and 8A without a diffuser and same selective control of the illumination light source driver 1113 of FIG. 11. A candela is a luminous flux per unit solid angle emitted by the miniature illumination light source(s) 106A-Y in a particular direction. The candela distribution plot 800B is a Cartesian luminous intensity graph which indicates the distribution of luminous intensity of radiance, which is luminous flux received by the target receiver surface, per unit solid angle per unit of projected area, in that direction (angle). Luminous intensity is shown in Si units of watts per steradian per square meter (W/sr). Candela distribution plot 800B includes graphs of four different cross-section angles (0°, 45°, 135°, and 180°) of the target receiver surface. Candela distribution plot 800B depicts fluctuations of the luminous intensity (W/sr on Y-axis) for different incident light ray angles (X-axis) for the four graphed cross-section angles of the receiver surface. The candela distribution plot 800B provides a visual guide to the type of distribution expected from a lighting device 100 incorporating the optical lens sheet 110 and miniature illumination light sources 106A-Y, including beam angle (e.g., narrow, wide, diffuse, beam, or spot lighting application) and light intensity. The candela distribution plot 800B of FIG. 8B shows the beam pattern 323 of FIG. 3 includes about an 18° beam angle for the four different receiver surface cross-section angles for a spot lighting application 310B.

FIG. 9A depicts an isometric view of a section of the luminaire 101 of FIG. 4 showing the design of the optical lens sheet 110 to cover the single miniature illumination light source 106D with the miniature optical lens 116D having a fourth convex surface geometry 155D and the base substrate 140 having a fourth thickness 131D. FIG. 9B is a candela distribution plot 900B of the outputted beam pattern 923 of FIGS. 4 and 9A with the optical lens sheet 110 designed with the fourth convex surface geometry 155D and the fourth thickness 131D. The candela distribution plot 900B is achieved utilizing the same lighting device 100 setup of FIGS. 4 and 9A without a diffuser and same selective control of the illumination light source driver 1113 of FIG. 11. As shown, the design of the optical lens sheet 110 with the fourth convex surface geometry 155D and the fourth thickness 131D achieves the outputted beam pattern 423 that is a medium symmetric beam distribution 405 for a regular flood lighting application 410B like that shown in FIG. 4. The candela distribution plot 900B of FIG. 9B shows the beam pattern 423 of FIG. 4 includes about a 32° beam angle for the four different receiver surface cross-section angles for a regular flood lighting application 410B.

FIG. 10A depicts an isometric view of a section of the luminaire 101 of FIG. 5 showing the design of the optical lens sheet 110 to cover the single miniature illumination light source 106D with the miniature optical lens 116D having a fifth convex surface geometry 155E and the base substrate 140 having a fifth thickness 131E. FIG. 10B is a candela distribution plot 1000B of the outputted beam pattern 1023 of FIGS. 5 and 10A with the optical lens sheet 110 designed with the fifth convex surface geometry 155E and the fifth thickness 131E. The candela distribution plot 1000B is achieved utilizing the same lighting device 100 setup of FIGS. 5 and 10A without a diffuser and same selective control of the illumination light source driver 1113 of FIG. 11. As shown, the design of the optical lens sheet 110 with the fifth convex surface geometry 155E and the fifth thickness 131E achieves the outputted beam pattern 523 that is a wide symmetric beam distribution 505 for a wide flood lighting application 510B. The candela distribution plot 1000B of FIG. 10B shows the beam pattern 523 of FIG. 5 includes about an 85° beam angle for the four different receiver surface cross-section angles for a regular flood lighting application 510B.

As shown in FIGS. 6A, 7A, 8A, 9A, and 10A an upper surface 170 of the base substrate 140 appears annularly arranged around the miniature optical lens 116D. The miniature optical lens 116D has a convex surface geometry 155A-E that is an aspheric or spheric contour and curves (i.e., bulges) outwards and away from the substantially planar lateral surface 102 forming the input surface 111 of the base substrate 140. However, in some examples, all or portions of the miniature optical lens 116D or the input surface 111 can be flat, sloped (e.g., upwards or downwards), or curved (depending on the specific beam distribution requirement), for example to form a freeform lens with multiple facets.

FIG. 11 is a functional block diagram of an example of a lighting device 1100 including an illumination light source driver 1113 and a luminaire 101 that has a miniature illumination light source matrix 105 and an optical lens sheet 110, in which the miniature illumination light source matrix 105 is selectively controlled by the illumination light source driver 1113. The depicted components of the luminaire 101 may be coupled without or with air gaps. The drawing (FIG. 11) shows the inclusion of the luminaire 101 in a lighting device 100, together with a suitable controller 1111. As shown in FIG. 11, the controller 1111 includes the illumination light source driver 1113 coupled to the luminaire 101 and a host processing system 1116. The controller 1111 may also include one or more communication interfaces 1117 and one or more sensors 1126.

Luminaire 101 provides illumination lighting in response to lighting control signals received from the driver system, shown as illumination light source driver 1113, for example, based on an illumination application (stored as program(s) 1127). Illumination light source driver 1113 selectively controls the miniature illumination light source matrix 105 to emit the incoming light rays 120A-Z for artificial illumination lighting. Illumination light source driver 1113 is configured and coupled to supply suitable power to drive the particular implementation of the miniature illumination light source matrix 105. The illumination lighting 124 emitted from the luminaire 101 with the outputted beam pattern 1123 has an intensity and/or other characteristic(s) that satisfy an industry acceptable performance standard for a general lighting application.

In an example, the luminaire 101 includes miniature illumination light source matrix 105, which emits incoming light rays 120A-Z. As described above, the miniature illumination light source matrix 105 is comprised of multiple miniature illumination light sources 106A-Y. Miniature illumination light sources 106A-Y of the miniature illumination light source matrix 105 are coupled directly or indirectly to the input surface 111 of the optical lens sheet 110, for example, without or with an air gap. Optical lens sheet 110 emits the output light rays 122A-Z with the desired outputted beam pattern 113.

FIG. 11 also provides an example of an implementation of the high layer logic and communications elements to control luminaire operations to provide selected illumination light, e.g., for a general illumination application. As shown, the controller 1111 includes a host processing system 1116, one or more sensors 1126 and one or more communication interface(s) 1117. Other implementations of the circuitry of the controller 1111 may be utilized. For the purpose of illumination operation, the circuitry of the controller 1111, in the example, is coupled to the miniature illumination light source matrix 105 to drive and control operation of the miniature illumination light source matrix 105. The circuitry of the controller 1111 may be configured to operate the miniature illumination light source matrix 105 to generate the illumination lighting 124 at least during an illumination state of the luminaire 101. The controller 1111 may implement a number of different illumination state configurations (e.g., on/off and dimming levels).

The host processing system 1116 provides the high level logic or "brain" of the controller 1111 and thus of the lighting device 100. In the example, the host processing system 1116 includes memories/storage 1125, such as a random access memory and/or a read-only memory, as well as programs 1127 stored in one or more of the memories/storage 1125. The programming 1127, in one example, configures the lighting device or system 1109 to implement illumination states of the controlled luminaire 101. As an alternative to distinct states, the programming 1127 may configure the lighting device 100 to implement a step-wise or substantially continuous adjustment of the relative intensities of the illumination light outputs of the controlled luminaire 101, encompassing settings to achieve the relative intensity levels of the states.

The memories/storage 1125 may also store various data, including luminaire configuration information 1128 or one or more configuration files containing such information, in addition to the illustrated programming 1127. The host processing system 1116 also includes a central processing unit (CPU), shown by way of example as a microprocessor (µP) 1123, although other processor hardware may serve as the CPU.

As shown, the microprocessor 1123 produces an input drive signal, which is conveyed to the illumination light source driver 1113 to ultimately switch the miniature illumination light sources 106A-Y of the miniature illumination light source matrix 105 on/off or set a dim level. The illumination light source driver 1113 produces an output drive signal, which switches the illumination light sources 106A-Y on/off or sets a dim level based on the input drive signal.

The ports and/or interfaces 1129 couple the processor 1123 to various elements of the lighting device 100 logically outside the host processing system 1116, such as the illumination light source driver 1113, the communication interface(s) 1117 and the sensor(s) 1126. For example, the processor 1123 by accessing programming 1127 in the memory 1125 controls operation of the illumination light source driver 1113 and thus operations of the luminaire 101 via one or more of the ports and/or interfaces 1129. In a similar fashion, one or more of the ports and/or interfaces 1129 enable the processor 1123 of the host processing system 116 to use and communicate externally via the communication interface(s) 1117; and the one or more of the ports 1129 enable the processor 1123 of the host processing system 1116 to receive data regarding any condition detected by a sensor 1126 for further processing.

In the operational examples, based on its programming 1127, the processor 1123 processes data retrieved from the memory 1125 and/or other data storage, and responds to light output parameters in the retrieved data to control the light generation by the luminaire 1100, particularly the illumination light sources 106A-Y. The light output control also may be responsive to sensor data from a sensor 1126. The light output parameters may include light intensity and light color characteristics of light from illumination light sources 106A-Y. The light output parameters may also control modulation of the light output, e.g., to carry information on the illumination lighting 124 output of the luminaire 101.

As noted, the host processing system 1116 is coupled to the communication interface(s) 1117. The communication interface(s) 1117 may communicate with other control elements, for example, a host computer of a building control and automation system (BCAS). The communication interface(s) 1117 may also support device communication with a variety of other equipment of other parties having access to the lighting device 100 in an overall/networked lighting system encompassing a number of lighting devices 100, e.g., for access to each lighting device 100 by equipment of a manufacturer for maintenance or access to an on-line server for downloading of programming instruction or configuration data for setting aspects of luminaire operation.

As outlined earlier, the host processing system 1116 also is coupled to the illumination light source driver 1113. The illumination light source driver 1113 is coupled to the miniature illumination light source matrix 105. Illumination light source driver 1113 may be a single integral unit or implemented in a variety of different configurations having any number of internal driver units. The separate drivers may be circuits configured to provide signals appropriate to the respective type of illumination light source driver 1113 utilized in the particular implementation of the luminaire 101, albeit in response to commands or control signals or the like from the host processing system 1116.

The host processing system 1116 and the illumination light source driver 1113 provide a number of control functions for controlling operation of the luminaire 100, including in the illumination states. In a typical example, execution of the programming 1127 by the host processing system 1116 and associated control via the illumination light source driver 1113 configures the luminaire 100 to perform functions, including functions to operate the miniature illumination light source matrix 105 to provide light output from the lighting device 100, e.g., based on the lighting device configuration information 1128.

In an example of the operation of the luminaire 101, the processor 1123 receives a configuration file 1128 via one or more of communication interfaces 1117. For illumination control, the configuration information in the configuration file 1128 may specify operational parameters of the luminaire 101, such as light intensity, light color characteristic, and the like for light from the miniature illumination light source matrix 105. Configuration file 1128 may also specify which of the miniature illumination light sources 106A-Y in the miniature illumination light source matrix 105 to turn off, on, or dim (e.g., outer, inner, middle, left, right) along with light intensity and color setting to achieve particular beam angles and lighting distributions via the optical lens sheet 110. The processor 1123 by accessing programming 1127 and using software configuration information 1128, from the storage/memories 1125, controls operation of the illumination light source driver 1113, and through that driver 1113 controls the miniature illumination light source matrix 105, e.g., to achieve a predetermined illumination light output intensity and/or color characteristic for a general illumination application of the luminaire 101, including settings for the miniature illumination light source matrix 105 appropriate to the current one of the luminaire states.

The lighting device 100 may be reconfigured, e.g., to change one or more parameters of the illumination light output, by changing the corresponding aspect(s) of the configuration data file 1128, by replacing the configuration data file 1128, or by selecting a different file from among a number of such files already stored in the data storage/memories 1125.

In other examples, the lighting device 100 may be programmed to transmit information on the light output from the luminaire 101. Examples of information that the lighting device 100 may transmit in this way include a code, e.g., to identify the luminaire 101 and/or the lighting device 100 or to identify the luminaire location. Alternatively or in addition, the light output from the luminaire 101 may carry downstream transmission of communication signaling and/or user data. The information or data transmission may involve adjusting or modulating parameters (e.g., intensity, color characteristic or the like) of the illumination light output of the luminaire 101. Alternatively, user data may be received via one of the communication interface(s) 1117 and processed in the controller 1111 to transmit such received user data via light output from the luminaire 101.

Although specially configured circuitry may be used in place of microprocessor 1123 and/or the entire host processing system 1116, the drawing depicts an example of the controller 1111 in which functions relating to the controlled operation of the lighting device 100, including operation of the luminaire 101, may be implemented by the programming 1127 and/or configuration data 1128 stored in a memory device 1125 for execution by the microprocessor 1123. The programming 1127 and/or data 1128 configure the processor 1123 to control system operations so as to implement functions of the lighting device 100 described herein.

Aspects of the software configurable lighting device 100 example therefore include "products" or "articles of manufacture" typically in the form of software or firmware that include executable code of programming 1127 and/or associated configuration data 1128 that is/are carried on or embodied in a type of machine readable medium. "Storage" type media include any or all of storage devices that may be used to implement the memory 1125, any tangible memory of computers or the like that may communicate with the lighting device 100 or associated modules of such other equipment. Examples of storage media include but are not limited to various semiconductor memories, tape drives, disk drives and the like, which may provide non-transitory storage at any time for the software or firmware programming 1127 and/or the configuration data 1128. All or portions of the programming and/or data may at times be communicated through the Internet or various other telecommunication networks. Such communications, for example, may enable loading of the programming and/or data from a computer or the like into the host processing system 1116 of the controller 1111, for example, from a management server or host computer of the lighting system service provider into a lighting device 100. Thus, another type of media that may bear the programming 1127 and/or the data 1128 includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible or "storage" media, terms such as computer or machine "readable medium" refer to any medium that participates in providing instructions to a processor for execution.

Figure 12A:
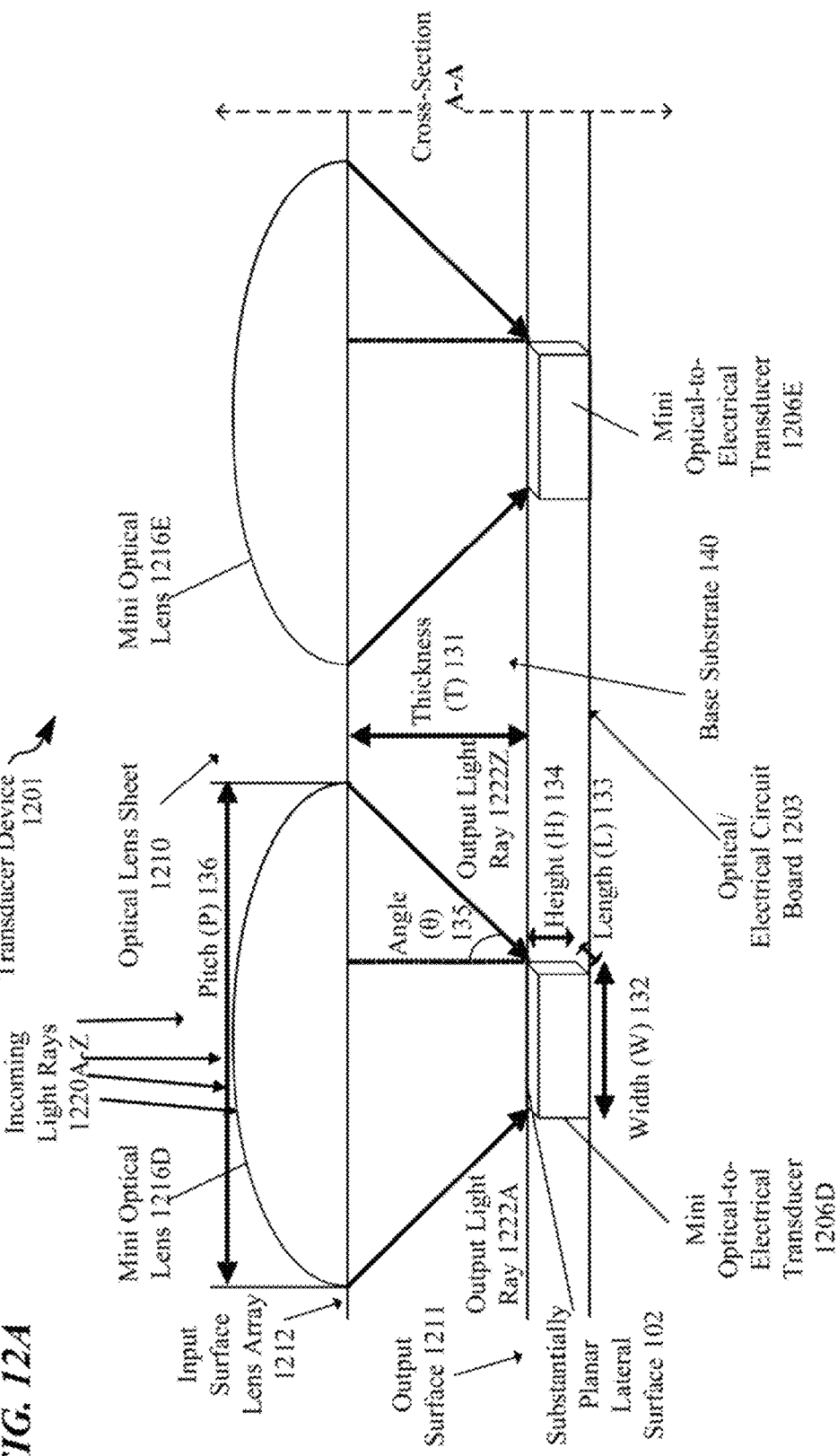
FIG. 12A-B are cross-sectional views of an optical lens sheet like that shown in FIGS. 2A-B, respectively but illustrating light rays to be optically sensed are steered to a miniature optical-to-electrical transducer through the surfaces to produce an electrical signal.
Figure 12B:
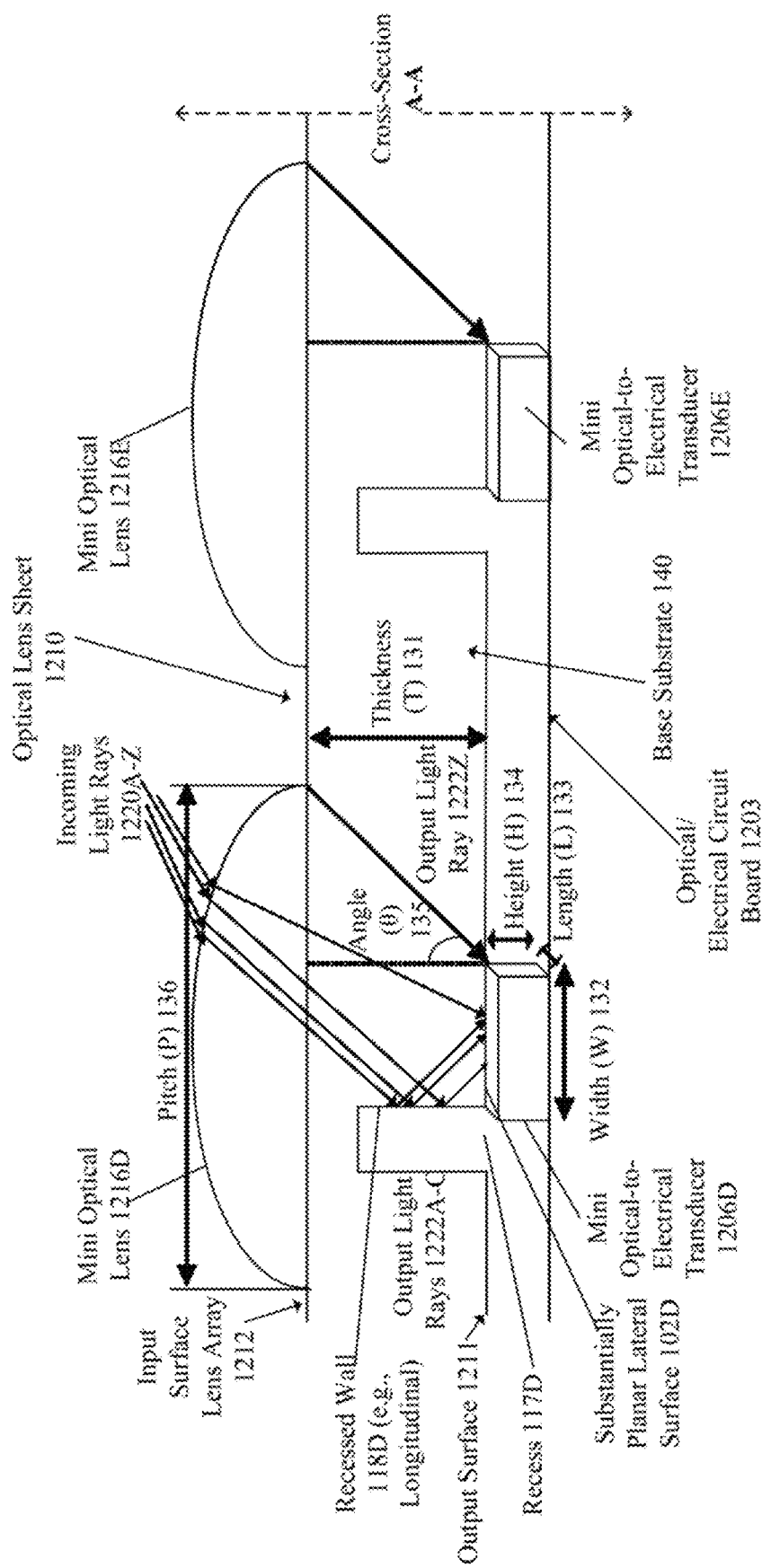

FIG. 12A-B are cross-sectional views of an optical lens sheet 1210 like that shown in FIGS. 2A-B, respectively but illustrating light rays to be optically sensed are steered to a miniature optical-to-electrical transducer 1206D through the surfaces to produce an electrical signal. Optical lens sheet 1210 is positioned over a miniature optical-to-electrical transducer matrix that includes miniature optical-to-electrical transducers 1206A-Y to form an optical-to-electrical transducer device 1201. Hence, the miniature optical-to-electrical transducer 1206D is in the center underneath the optical lens sheet 1210. The cross-sectional views A-A in FIGS. 12A-B are portions of the optical-to-electrical transducer device 1201, which has twenty-five optical-to-electrical transducers 1206A-Y arranged in rows and columns like the luminaire 100 of FIG. 1. Traces of several incoming light rays 1220A-Z that are received by the miniature optical-to-electrical transducer 1206D through the surfaces of the optical lens sheet 1210 after conversion in into output light rays 1222A-Z are depicted, which drive the miniature optical-to-electrical transducer 1206D. The optical lens sheet 1210 steers the beam distribution to the depicted miniature optical-to-electrical transducer 1206D. An optical-to-electrical transducer is a device that converts between optical and electrical signals, that is to say an optical-to-electrical converter, that is to say, a light sensor or detector or a photovoltaic device Hence, in the previous examples, the miniature illumination light sources 106A-Y are miniature electrical-to-optical transducers in which electrical power is used to emit light. In the examples of FIGS. 12A-C and 13, the miniature optical-to-electrical transducers 1206A-Y convert the received incoming light into an electrical signal, for example, a photodetector or photodiode for a camera, which takes light as a signal and produces an electrical signal, but are similar in size to the miniature illumination light sources 106A-Y (0.2 mm×0.2 mm or less in both width and length).

The optical lens sheet 1210 of FIGS. 12A-B behaves in reverse of the optical lens sheet 110 described previously for the miniature illumination light sources 106A-Y. Hence, optical lens sheet 1210 includes an input surface lens array 1212 and an output surface 1211 coupled to direct light to the optical-to-electrical transducers 1206D. The input surface lens array 1212 includes twenty-five miniature optical lenses 1216A-Y. In FIG. 12A, the output surface 1211 a substantially planar lateral surface 102. In FIG. 12B, the output surface 1211 alternates between respective recesses 117A-Y and respective substantially planar lateral surfaces 112A-Y. Incoming light rays 1220A-Z first pass through the input surface lens array 1212 where the incoming light rays 1220A-Z undergo refraction. After passing through the input surface lens array 1212, the refracted incoming light rays then pass through the output surface 1211 as output light rays 1222A-Z to be received by the optical-to-electrical transducer 1206D.

In both FIGS. 12A-B, an optical-to-electrical transducer device 1201 includes a plurality of miniature optical-to-electrical transducers 1206A-Y. Each miniature optical-to-electrical transducer 1206A-Y is a photo sensor or a photovoltaic device. Each miniature optical-to-electrical transducer 1206A-Y is configured to be driven by received incoming light rays 1220A-Z to produce a respective electrical signal and to be individually activated for outputting the respective electrical signal in response to light. The optical-to-electrical transducer device 1201 further includes an optical lens sheet 1219 positioned directly over and abutting the miniature optical-to-electrical transducers 1206A-Y and configured to extend over the miniature optical-to-electrical transducers 1206A-Y and including an input surface lens array 1212 coupled to direct light to the optical-to-electrical transducers 1206A-Y and an output surface 1211.

In FIG. 12A, the output surface 1211 is a substantially planar lateral surface 102 extending across an entirety of the miniature optical-to-electrical transducers 1206A-Y. The input surface lens array 1212 includes a plurality of miniature optical lenses 1216A-Y, including a respective miniature optical lens 1216A-Y for each of the miniature optical-to-electrical transducers 1206A-Y to refract the received incoming light rays 1220A-Z passing through to shape or steer the incoming light rays 1220A-Z into output light rays 1222A-Z to be selectively received by at least one of the miniature optical-to-electrical transducers 1206A-Y.

In FIG. 12B, the output surface 1211 has a respective substantially planar lateral surface 102A-Y alternating with a respective recessed (e.g., longitudinal) wall 118A-Y for each of the miniature optical-to-electrical transducers 1206A-Y to create a total internal reflection (TIR) contour that totally internal reflects the received incoming light rays 1220A-Z. The input surface lens array 1212 includes a plurality of miniature optical lenses 1216A-Y, including a respective miniature optical lens 1216A-Y for each of the miniature optical-to-electrical transducers 1206A-Y to refract the received incoming light rays 1220A-Z passing through to shape or steer the incoming light rays 1220A-Y into output light rays 1222A-Z to be selectively received by at least one of the miniature optical-to-electrical transducers 1206A-Y.

Generally, the incoming light rays 1220A-Z to drive one or more of the optical-to-electrical transducers 1206A-Y first pass through the input surface lens array 1212 where the incoming light rays 1220A-Z undergo refraction. In FIG. 12A, after passing through the input surface lens array 1212, the refracted incoming light rays 1220A-Z then pass through the output surface 1211 where the incoming light rays 1220A-Z undergo further refraction to shape or steer the incoming light rays 1220A-Z into output light rays 1222A-Z to be selectively received by at least one of the miniature optical-to-electrical transducers 1206A-Y. In FIG. 12B, after passing through the input surface lens array 1212, the incoming light rays 1220A-Z then pass through the output surface 1211 where the incoming light rays 1220A-Z then strike the respective recessed wall 118A-Y where the incoming light rays 1220A-Z undergo total internal reflection (TIR) to be selectively received as output light rays 1222A-Z by at least one of the miniature optical-to-electrical transducers 1206A-Y.

Figure 12C:
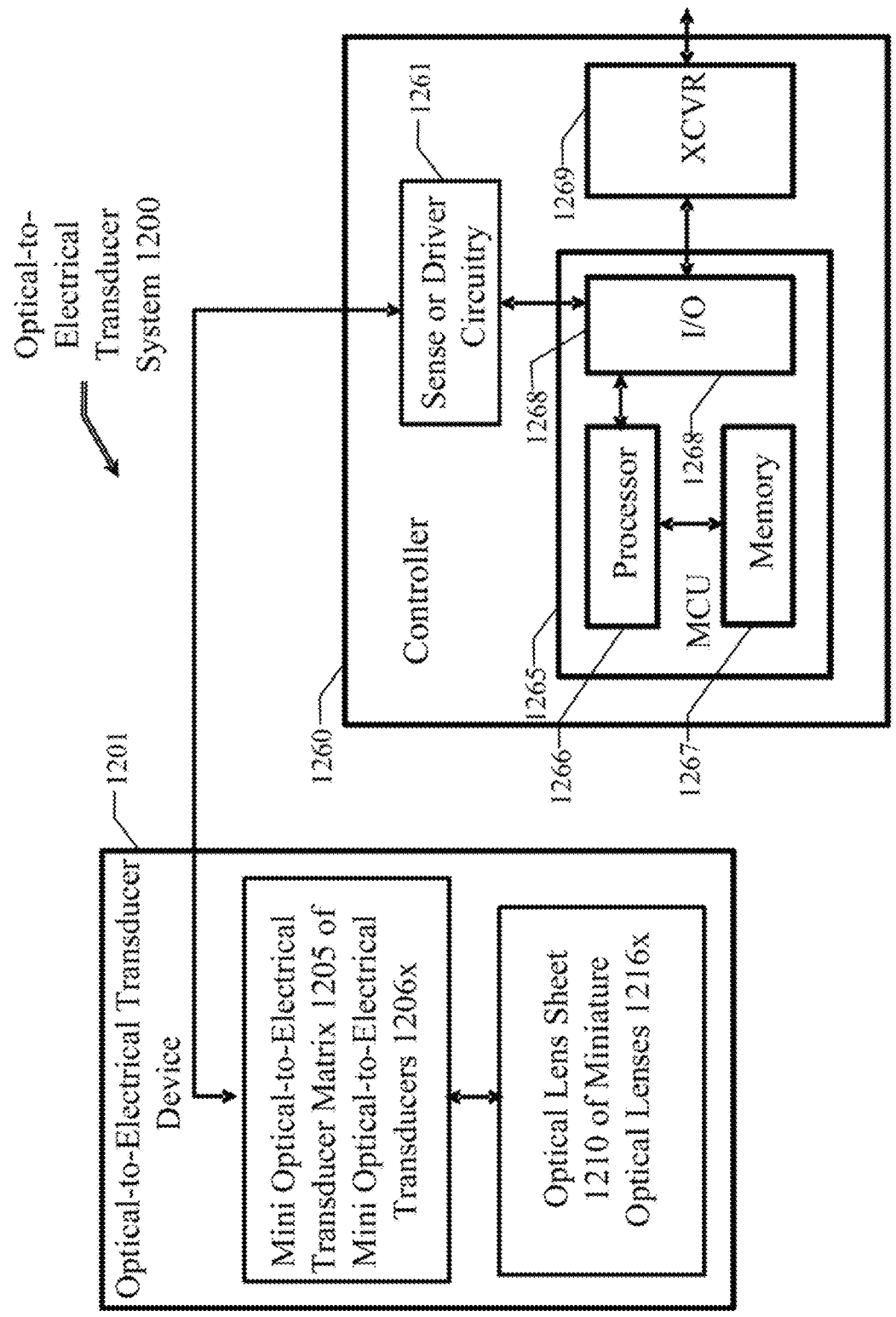
FIG. 12C is a simplified functional block diagram of an optical-to-electrical transducer system, which includes a configurable optical-to-electrical transducer device and a controller.

FIG. 12C is a simplified functional block diagram of an optical-to-electrical transducer system 1200, which includes a configurable optical-to-electrical transducer device 1201 and a controller 1260. The optical-to-electrical transducer device 1201 combines a miniature optical lens 1216*x* like that described above with a miniature optical-to-electrical transducer 1206*x*. Although associated circuitry may be provided in the optical-to-electrical transducer device 1201, the example shows circuitry in the controller 1260, which may be somewhat separate from or even remote from the optical-to-electrical transducer device 1201.

Examples of miniature optical-to-electrical transducers 1206*x* include various micro sensors or detectors, photovoltaic devices and the like to be individually activated for outputting the respective electrical signal in response to light. Miniature optical-to-electrical transducers 1206*x* discussed herein are responsive to light, and the light may be visible light, ultraviolet light, infrared, near infrared or light in other portions of the optical spectrum.

Examples of miniature electrical-to-optical transducers, such as miniature illumination light sources 106*x* include various micro versions of light emitters, although the emitted light may be in the visible spectrum or in other wavelength ranges. Suitable micro light generation sources for use as the electrical-to-optical transducer 106*x* include various conventional lamps, such as incandescent, fluorescent or halide lamps; one or more light emitting diodes (LEDs) of various types, such as planar LEDs, micro LEDs, micro organic LEDs, LEDs on gallium nitride (GaN) substrates, micro nanowire or nanorod LEDs, photo pumped quantum dot (QD) LEDs, micro plasmonic LED, micro resonant-cavity (RC) LEDs, and micro photonic crystal LEDs; as well as other sources such as micro super luminescent Diodes (SLD) and micro laser diodes. Of course, these light generation technologies are given by way of non-limiting examples, and other light generation technologies may be used to implement the electrical-to-optical transducer 106*x*.

The optical lens sheet 1210, including the miniature optical lenses 1216*x*, is controlled to selectively optically change or spatially (optically) modulate the light distribution output to the miniature optical-to-electrical transducers 1206*x* of the mini optical-to-electrical transducer matrix 1205 and thus from the optical-to-electrical transducer device 1201. An optical lens sheet 1210, including the miniature optical lens 1216*x*, may support controlled beam steering, controlled beam shaping or a combination of controlled beam steering and shaping.

The overall optical-to-electrical transducer device 1201 may be configured as an imager, other light responsive sensor, light responsive power source, or the like. The light detector may be an array of light detectors, a photo-detector such as a photodiode, or a photovoltaic device, depending on the desired function of the optical-to-electrical transducer device 1201. Other suitable light detectors for use as miniature optical-to-electrical transducer 1206*x* include charge-coupled device (CCD) arrays, complementary metal-oxide-semiconductor (CMOS) arrays, photomultipliers, image intensifiers, phototransistors, photo resistors, thermal imagers, and micro-electromechanical systems (MEMS) imagers. Nonetheless, virtually any micro detector of light may be used as the miniature optical-to-electrical transducer 1206*x*. Suitable light detectors will be known to one of ordinary skill in the art from the description herein. The optical lens sheet 1210, including the miniature optical lens 1216*x*, is controlled to selectively optically change or spatially (optically) modulate the field of view of light coming into the optical-to-electrical transducer device 1201 for delivery to miniature optical-to-electrical transducer 1206*x*. The optical lens sheet 1210 may support controlled beam steering, controlled beam shaping or a combination of controlled beam steering and shaping, with respect to light from a field of intended view for the particular optical-to-electrical application of the optical-to-electrical transducer device 1201.

While light source examples and light detector examples are described separately, it will be understood that both types of optical-to-electrical transducers 1206x and electrical-to-optical transducers 106x may be present in a single optical-to-electrical transducer device 1201 and/or some optical transducers can serve both input and output functions (e.g. some LEDs can be multiplexed between the emitting operation and a light detection operation). Such a combined arrangement or operation, for example, may advantageously provide capabilities to reconfigure the light output distribution in accordance with a desired light detection pattern.

An optical-to-electrical transducer 1206x and electrical-to-optical transducer 106x, such as a light emitter or a light detector, often connect to corresponding electrical circuitry to operate the particular type of transducer, e.g. a sense circuit to process an output signal from a detector (and provide power to the detector if necessary) or a driver circuit to supply power to an emitter, respectively. Hence, to operate the optical-to-electrical transducer 1206x and electrical-to-optical transducer 106x, the controller 1260 includes corresponding sense or driver circuitry 1261. The type of circuitry 1261 would depend on the transducer type, specifically whether it is an optical-to-electrical transducer 1206x and electrical-to-optical transducer 106x.

The controller 1260 also includes a processor, one or more digital storage media, data and programming in the storage and appropriate input/output circuitry. Although other processor based architectures may be used (another example is described later regarding FIG. 15), the example of controller 1260 utilizes a Micro-Control Unit (MCU) 1265, which implements the control logic for the controller 1260 and thus of the optical-to-electrical transducer system 1245. For example, the MCU 1265 implements the logic for control of operations of the associated optical-to-electrical transducer device 1201. Although shown as controlling only one such optical-to-electrical transducer device 1201, the MCU 1265 and controller 1260 may control a number of such optical-to-electrical transducer devices 1201.

The MCU 1265 may be a microchip device that incorporates a processor 1266 serving as the programmable central processing unit (CPU) of the MCU 1265 as well as one or more memories, represented by memory 1267 in the drawing. The memory 1267 is accessible to the processor 1266, and the memory or memories 1267 store executable programming for the CPU formed by processor 1266 as well as data for processing by or resulting from processing of the processor 1266. The MCU 1265 may be thought of as a small computer or computer like device formed on a single chip. Such devices are often used as the configurable control elements embedded in special purpose devices rather than in a computer or other general purpose device. A variety of available MCU chips, for example, may be used as the MCU 1265 in the controller 1260 of optical-to-electrical transducer system 1200.

The MCU 1265 in this example also includes various input and output (I/O) interfaces, shown collectively by way of example as interface 1268 in FIG. 12. The I/O interfaces 1268, for example, support a control input and/or output to the sense or driver control circuitry 1261 (for the optical-to-electrical transducer 1206x or electrical-to-optical transducer 106x). The I/O interfaces 1268 also support input/output communications with one or more electronic devices, which may be connected to or incorporated in the optical-to-electrical transducer system 1200 (e.g. to provide a user interface not shown) or which may be remote.

In the illustrated example, the controller 1260 also includes a communication transceiver (XCVR) 1269 coupled to the processor 1266 (and possibly to the memory 1267) via an I/O output interface 1268 of the MCU 1265. Although shown separately, the transceiver 1269 may be implemented in circuitry on the same chip as the elements of the MCU 1265. Although the drawing shows only one transceiver 1269, controller 1260 may include any number of transceivers, for example, to support additional communication protocols and/or provide communication over different communication media or channels.

The transceiver 1269 supports communication with other control or processing equipment, for example, with a remote user interface device and/or with a host computer of a building control and automation system (BCAS). The transceiver 1269 may also support system communication with a variety of other equipment of other parties having access to the optical-to-electrical transducer system 1200 in an overall/networked system encompassing a number of similar optical-to-electrical transducer systems 1200, e.g. for access to each optical-to-electrical transducer system 1200 by equipment of a manufacturer for maintenance or access to an on-line server for downloading of programming instructions or configuration data for setting aspects of sensing or lighting operation of the associated optical-to-electrical transducer device 1201. The circuitry of the transceiver 1269 may support such communication(s) over any available medium, such as wire(s), cable, optical fiber, free-space optical link or radio frequency (RF) link.

Figure 13:
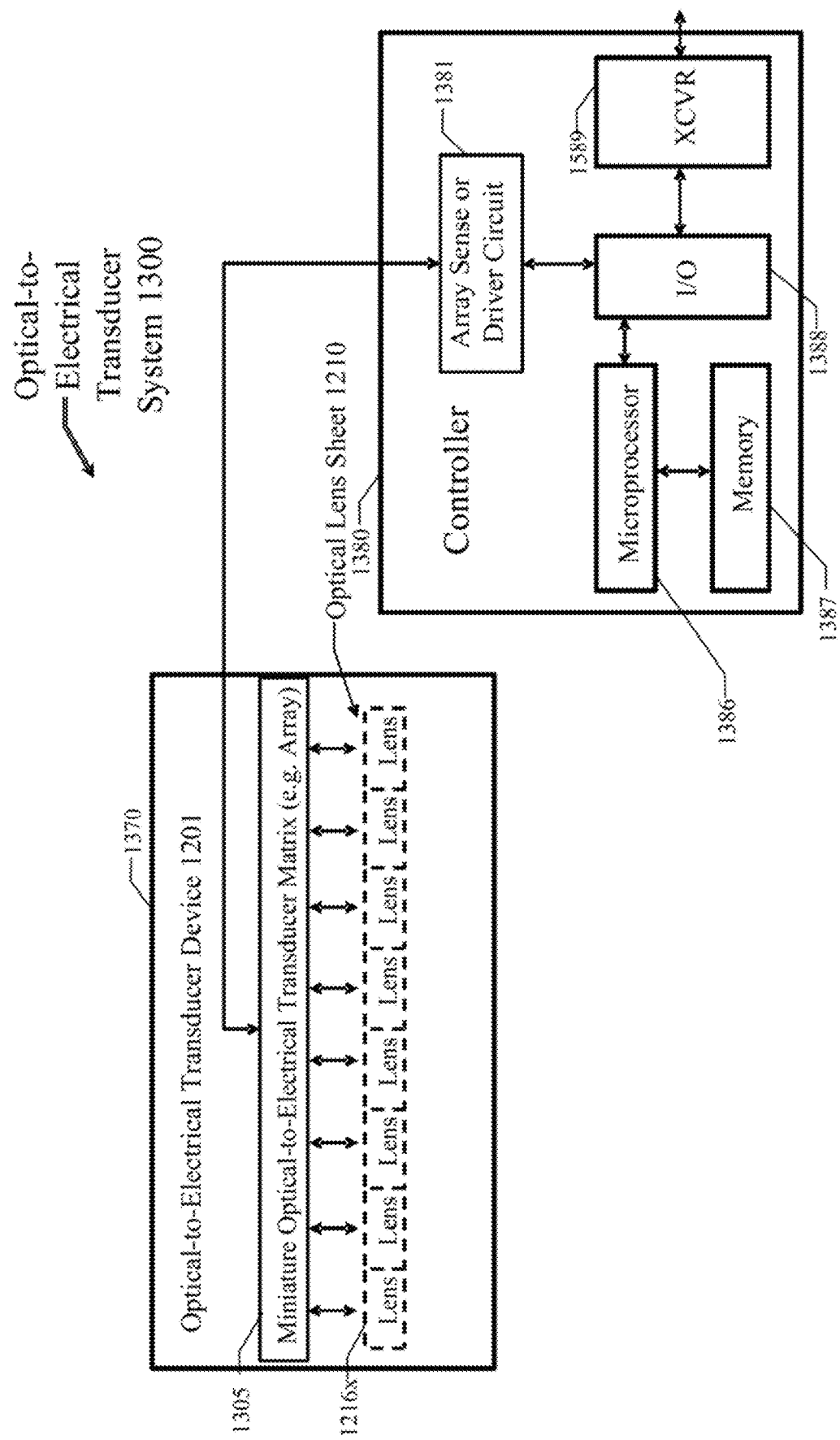
FIG. 13 is a simplified functional block diagram of an optical-to-electrical transducer device combining an optical lens sheet like that described with optical-to-electrical transducers that form a miniature optical-to-electrical transducer matrix.

FIG. 13 is a simplified functional block diagram of an optical-to-electrical transducer device 1301 combining an optical lens sheet 1210 like that described with optical-to-electrical transducers 1306x that form a miniature optical-to-electrical transducer matrix 1305. The drawing also depicts an example of associated circuitry, which is implemented in a controller 1380. The output surface lens array 1212 of the optical lens sheet 1210 is used to provide selectively controllable beam steering and/or beam shaping for light detectors (or light emitters in other examples). The controller 1380 may be included in the optical-to-electrical transducer device 1201, or the controller 1380 may be somewhat separate from or even remote from the optical-to-electrical transducer device 1201.

The miniature optical-to-electrical transducer 1206x is configured to operate with the optical lens sheet 1210. Miniature optical-to-electrical transducer 1206x is a lighting input responsive device (e.g. detectors or photovoltaic devices) and may include a micro sized complementary metal-oxide-semiconductor (CMOS) image sensor, a charge-coupled device (CCD) image sensor or other image detector array like any of those used in digital cameras. Each actual detector at a pixel of the image sensor array could be coupled to one or more of the miniature optical lenses 1216x of the optical lens sheet 1210.

A miniature optical-to-electrical transducer 1206x connects to corresponding electrical circuitry to operate the particular type of transducer, e.g. sense circuitry to process output signals from the detectors (and provide power to the detectors if/when necessary). Hence, to operate the optical-to-electrical transducers 1206x, the controller 1380 includes corresponding an array sense circuit 1381. In the case of miniature electrical-to-optical transducers 106x the controller 1380 includes a corresponding driver circuit 1381.

The controller 1380 also includes a processor, which in this example, is implemented by a microprocessor 1386. The microprocessor 1386 is programmed to implement control and other processing functions of a central processing unit (CPU) of the controller 1380. The microprocessor 1386, for example, may be based on any known or available microprocessor architecture, such as a Reduced Instruction Set Computing (RISC) using ARM architecture, as commonly used today in mobile devices and other portable electronic devices. Of course, other microprocessor circuitry may be used to form the CPU of the controller 1580. Although the illustrated example includes only one microprocessor 1386, for convenience, a controller 1380 may use a multi-processor architecture.

The controller 1380 also includes one or more digital storage media, represented by the memory 1387, for storage of data and programming. The storage media represented by the memory 1387 may include volatile and/or non-volatile semiconductor memory, any suitable type of magnetic or optical storage media, etc. The microprocessor 1386 implements the control logic for the controller 1380 and thus of the optical-to-electrical transducer system 1300, based on executable instructions of the programming, which in the example is stored in the memory 1387. The executable instructions may be firmware or software instructions, to configure the microprocessor 1386 to perform light detection operations, etc. Based on execution of the program instructions, the microprocessor 1386, for example, implements the logic for control of operations of the miniature optical-to-electrical transducer matrix 105, in the associated optical-to-electrical transducer device 1370. Although shown as controlling only one such optical-to-electrical transducer device 1370, the microprocessor 1386 and thus the controller 1380 may control a number of such optical-to-electrical transducer devices 1370.

Although shown in simplified block form, the architecture of controller 1380 may be similar to that of any of a variety of types of types of other smart electronic devices, such as an architecture for a personal computer or an architecture for a mobile terminal device.

The microprocessor 1123 (FIG. 11), processor 1266 of the MCU 1365 (FIG. 12C), the microprocessor 1386 (FIG. 13) are examples of processors that may be used to control the luminaire 101 and the optical-to-electrical transducer device 101 to control or respond to outputs of any associated optical/electrical transducer(s). As used herein, a processor is a hardware circuit having elements structured and arranged to perform one or more processing functions, typically various data processing functions. Although discrete logic components could be used, the examples utilize components forming a programmable central processing unit (CPU). A processor for example includes or is part of one or more integrated circuit (IC) chips incorporating the electronic elements to perform the functions of the CPU.

The microprocessor 1123 (FIG. 11), processor 1266 of the MCU 1365 (FIG. 12C), the microprocessor 1386 (FIG. 13) execute programming or instructions to configure the lighting device 100 or optical-to-electrical transducer system 1200, 1300 to perform various operations. For example, such operations may include various general operations (e.g., a clock function, recording and logging operational status and/or failure information) as well as various system-specific operations (e.g. controlling beam steering and beam shaping of input or output light, operation of the transducer(s) and the like) incorporating the optical lens sheets 110, 1210 and associated miniature transducer(s) 106$x$, 1206$x$. Although a processor may be configured by use of hardwired logic, typical processors in lighting devices are general processing circuits configured by execution of programming, e.g. instructions and any associated setting data from the memories shown or from other included storage media and/or received from remote storage media.

As outlined above, a class of applications of the optical-to-electrical transducer system 1200, 130 can be with suitable light source type of electrical-to-optical transducers 106$x$ to provide a luminaire. Other large format lighting applications for the optical-to-electrical transducer system 1200 constructs include vehicle lighting or the like.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises or includes a list of elements or steps does not include only those elements or steps but may include other elements or steps not expressly listed or inherent to such process, method, article, or apparatus. An element preceded by "a" or "an" does not, without further constraints, preclude the existence of additional identical elements in the process, method, article, or apparatus that comprises the element.

Unless otherwise stated, any and all measurements, values, ratings, positions, magnitudes, sizes, and other specifications that are set forth in this specification, including in the claims that follow, are approximate, not exact. Such amounts are intended to have a reasonable range that is consistent with the functions to which they relate and with what is customary in the art to which they pertain. For example, unless expressly stated otherwise, a parameter value or the like may vary by as much as ±10% from the stated amount.

In addition, in the foregoing Detailed Description, it can be seen that various features are grouped together in various examples for the purpose of streamlining the disclosure. This method of disclosure is not to be interpreted as reflecting an intention that the claimed examples require more features than are expressly recited in each claim. Rather, as the following claims reflect, the subject matter to be protected lies in less than all features of any single disclosed example. Thus the following claims are hereby incorporated into the Detailed Description, with each claim standing on its own as a separately claimed subject matter.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

What is claimed is:
1. A lighting device comprising:
 a luminaire including:
  a miniature illumination light source matrix including miniature illumination light sources configured to be driven by electrical power to emit incoming light rays for illumination lighting, wherein:

each of the miniature illumination light sources have a length dimension (L) of 0.2 millimeters or less and a width dimension (W) of 0.2 millimeters or less, and a pitch (P) between the respective miniature optics lens for each of the miniature illumination light sources is 2 millimeters or less; and an optical lens sheet positioned directly over and abutting the miniature illumination light source matrix and configured to extend over the illumination light source matrix and including an input surface coupled to receive the incoming light rays emitted by the miniature illumination light sources and an output surface lens array, wherein:

the input surface is a substantially planar lateral surface extending across an entirety of the miniature illumination light source matrix; and the output surface lens array includes a plurality of miniature optical lenses, including a respective miniature optical lens for each respective one of the miniature illumination light sources to refract the incoming light rays from the respective miniature illumination light source into a portion of an outputted beam pattern of output light rays for the illumination lighting; and an illumination light source driver coupled to the miniature illumination light source matrix of the luminaire to selectively control the miniature illumination light sources in the miniature illumination light source matrix to emit the incoming light rays received by the input surface of the optical lens sheet to adjust the outputted beam pattern of the output light rays from the optical lens sheet.

2. The lighting device of claim 1, wherein:
the miniature illumination light sources are arranged in a first series of linear miniature illumination light source rows; and
the miniature optical lenses of the output surface lens array are arranged in a second series of linear miniature optical lens rows.

3. The lighting device of claim 2, wherein:
each of the linear miniature illumination light source rows of the first series have a first number of illumination light sources; and
each of the linear miniature optical lens rows of the second series have a second number of miniature optical lenses.

4. The lighting device of claim 1, wherein:
incoming light rays for illumination lighting emitted by at least one of the miniature illumination light sources first pass through the input surface where the incoming light rays undergo refraction to shape or steer the illumination lighting; and
after passing through the input surface, the refracted light rays then pass through the respective miniature optical lens where the refracted light rays undergo further refraction to further shape or steer the illumination lighting into the output light rays of the outputted beam pattern.

5. The lighting device of claim 1, wherein the output light rays of the outputted beam pattern selectively form a symmetric beam distribution or an asymmetric beam distribution.

6. The lighting device of claim 1, wherein:
a thickness (T) of the optical lens sheet is at least five times greater than a largest dimension of each of the miniature illumination light sources.

7. The lighting device of claim 6, wherein:
the optical lens sheet is formed of acrylic, polycarbonate, silicon, or glass; and
a pitch (P) between the respective miniature optical lens for each of the miniature illumination light sources equals at least ten times the largest dimension of each of the miniature illumination light sources.

8. The lighting device of claim 7, wherein:
the respective miniature optical lens for each of the miniature illumination light sources is an aspherical or spherical shaped surface; and
the pitch (P) is a diameter of 2 millimeters or less.

9. The lighting device of claim 1, wherein:
each of the miniature illumination light sources are a cuboid.

10. The lighting device of claim 1, wherein:
a thickness (T) of the optical lens sheet is 1 millimeter or less; and
the miniature illumination light source matrix includes a mask having an array of apertures or controllable light valves and at least one large illumination light source optically coupled to the apertures or the controllable light valves, wherein:
each of the apertures or controllable light valves are 0.2 millimeters or less in the length dimension (L) and 0.2 millimeters or less in the width dimension (W),
each of the apertures or controllable light valves are optically coupled to at least one large illumination light source, and
the at least one large illumination light source is greater than 0.2 millimeters (L) in the length dimension (L) and greater than 0.2 millimeters in the width dimension (W).

11. The lighting device of claim 1, wherein:
a thickness (T) of the optical lens sheet is 0.75 millimeters or less for a spot lighting application; and
the miniature optical lenses of the output surface lens array refract the incoming light rays passing through to shape or steer the illumination lighting into the output light rays of the outputted beam pattern for the spot lighting application.

12. The lighting device of claim 1, wherein:
a thickness (T) of the optical lens sheet is 1 millimeter or less for a flood lighting application; and
the miniature optical lenses of the output surface lens array refract the incoming light rays passing through to shape or steer the illumination lighting into the output light rays of the outputted beam pattern for the flood lighting application.

13. The lighting device of claim 1, wherein:
a thickness (T) of the optical lens sheet is 1.1 millimeters or less for a diffuse lighting application; and
the miniature optical lenses of the output surface lens array refract the incoming light rays passing through to shape or steer the illumination lighting into the output light rays of the outputted beam pattern for the diffuse lighting application.

14. A lighting device comprising:
a luminaire including:
a miniature illumination light source matrix including miniature illumination light sources configured to be driven by electrical power to emit incoming light rays for illumination lighting; and
an optical lens sheet positioned directly over and abutting the miniature illumination light source matrix and configured to extend over the illumination light source matrix and including an input surface coupled to receive the incoming light rays emitted by the miniature illumination light sources and an output surface lens array, wherein:
for each of the miniature illumination light sources, the input surface has a respective substantially planar lateral surface and a respective recessed wall to create a respective recess with a total internal reflection (TIR) contour that totally internal reflects the incoming light rays into refracted TIR light rays; and
the output surface lens array includes a plurality of miniature optical lenses, including a respective miniature optical lens for each respective one of the miniature illumination light sources to refract the refracted TIR light rays from the respective miniature illumination light source into a portion of an outputted beam pattern of output light rays for the illumination lighting; and
an illumination light source driver coupled to the miniature illumination light source matrix of the luminaire to selectively control the miniature illumination light sources in the miniature illumination light source matrix to emit the incoming light rays received by the input surface of the optical lens sheet to adjust the outputted beam pattern of the output light rays from the optical lens sheet.

15. The lighting device of claim 14, wherein:
the respective recessed wall is a flat or curved indentation of the input surface that extends in a longitudinal direction, a lateral direction, or a combination thereof to form the respective recess; and
the respective recess is a cavity that is an air pocket in the input surface.

16. The lighting device of claim 14, wherein:
incoming light rays for illumination lighting emitted by at least one of the miniature illumination light sources first pass through the respective substantially planar lateral surface where the incoming light rays undergo refraction to shape or steer the illumination lighting;
after passing through the input surface, a subset of the refracted incoming light rays then strike the respective recessed wall where the subset of the refracted incoming light rays undergo total internal reflection (TIR) to become the refracted TIR light rays to further shape or steer the illumination lighting; and
after striking the respective recessed wall, the refracted TIR light rays pass through the respective miniature optical lens to undergo further refraction to further shape or steer the illumination lighting into output light rays of the outputted beam pattern.

17. The lighting device of claim 16, wherein the outputted beam pattern has an asymmetric beam distribution.

18. An optical-to-electrical transducer device comprising:
a plurality of miniature optical-to-electrical transducers, each miniature optical-to-electrical transducer being configured to be driven by received incoming light rays to produce a respective electrical signal and to be individually activated for outputting the respective electrical signal in response to light;
an optical lens sheet positioned directly over and abutting the miniature optical-to-electrical transducers and configured to extend over the miniature optical-to-electrical transducers and including an input surface lens array coupled to direct light to the optical-to-electrical transducers and an output surface, wherein:
(a)(i) the output surface is a substantially planar lateral surface extending across an entirety of the miniature optical-to-electrical transducers, and (ii) the input surface lens array includes a plurality of miniature optical lenses, including a respective miniature optical lens for each of the miniature optical-to-electrical transducers to refract the received incoming light rays passing through to shape or steer the incoming light rays into output light rays to be selectively received by at least one of the miniature optical-to-electrical transducers; or
(b)(i) the output surface has a respective substantially planar lateral surface alternating with a respective recessed wall for each of the miniature optical-to-electrical transducers to create a total internal reflection (TIR) contour that totally internal reflects the received incoming light rays as output light rays, and (ii) the input surface lens array includes a plurality of miniature optical lenses, including a respective miniature optical lens for each of the miniature optical-to-electrical transducers to refract the incoming rays passing through to shape or steer the incoming light rays into output light rays to be selectively received by at least one of the miniature optical-to-electrical transducers.

19. The optical-to-electrical transducer device of claim 18, wherein:
the incoming light rays to drive one or more of the optical-to-electrical transducers first pass through the input surface lens array where the incoming light rays undergo refraction; and
after passing through the input surface lens array, the incoming light rays then pass through the output surface where:
(a) the incoming light rays undergo further refraction to shape or steer the incoming light rays into the output light rays to be selectively received by at least one of the miniature optical-to-electrical transducers; or
(b) the incoming light rays then strike the respective recessed wall where the incoming light rays undergo total internal reflection (TIR) to be selectively received as output light rays by at least one of the miniature optical-to-electrical transducers.

20. The optical-to-electrical transducer device of claim 18, wherein each miniature optical-to-electrical transducer is a photo sensor or a photovoltaic device.

* * * * *